(12) United States Patent
Yamano

(10) Patent No.: US 9,564,364 B2
(45) Date of Patent: Feb. 7, 2017

(54) SEMICONDUCTOR DEVICE, SEMICONDUCTOR PACKAGE, METHOD FOR MANUFACTURING SEMICONDUCTOR DEVICE, AND METHOD FOR MANUFACTURING SEMICONDUCTOR PACKAGE

(75) Inventor: Takaharu Yamano, Nagano (JP)

(73) Assignee: Shinko Electric Industries Co., LTD., Nagano-Ken (JP)

( * ) Notice: Subject to any disclaimer, the term of this patent is extended or adjusted under 35 U.S.C. 154(b) by 203 days.

(21) Appl. No.: 13/565,983

(22) Filed: Aug. 3, 2012

(65) Prior Publication Data

US 2013/0037943 A1    Feb. 14, 2013

(30) Foreign Application Priority Data

Aug. 10, 2011   (JP) .................................. 2011-175197
Dec. 9, 2011    (JP) .................................. 2011-270410

(51) Int. Cl.
H01L 23/48    (2006.01)
H01L 21/00    (2006.01)
(Continued)

(52) U.S. Cl.
CPC ......... H01L 21/76898 (2013.01); H01L 24/03 (2013.01); H01L 24/05 (2013.01);
(Continued)

(58) Field of Classification Search
CPC  H01L 23/3114; H01L 23/49805; H01L 24/01; H01L 33/48; H01L 2221/68313; H01L 2223/54486; H01L 2224/01; H01L 2224/04105; H01L 2224/12105; H01L 2224/28105; H01L 2924/18301
(Continued)

(56) References Cited

U.S. PATENT DOCUMENTS 5,952,718 A   9/1999  Ohtsuka et al.
6,107,120 A   8/2000  Ohtsuka et al.
(Continued)

FOREIGN PATENT DOCUMENTS

JP   2003086620 A   3/2003
JP   2006-108328     4/2006
(Continued)

OTHER PUBLICATIONS

Office Action from corresponding Japanese Patent Application No. JP2011-270410, dated Dec. 18, 2012, pp. 1-2.
(Continued)

*Primary Examiner* — Julio J Maldonado
*Assistant Examiner* — Moin Rahman
(74) *Attorney, Agent, or Firm* — Wolf, Greenfield & Sacks, P.C.

(57) ABSTRACT

A semiconductor device includes a semiconductor substrate, which includes a through hole that extends through the semiconductor substrate. An insulative layer includes a first surface, an opposite second surface covering the semiconductor substrate, and an opening aligned with the through hole. An insulative film covers an inner wall surface of the semiconductor substrate and the opening. A through electrode is formed in the through hole and the opening inward from the insulative film. The through electrode includes a first end surface that forms a pad exposed from the first surface of the insulative layer. The first end surface of the through electrode is flush with the first surface of the insulative layer.

20 Claims, 19 Drawing Sheets

(51) Int. Cl.
*H01L 21/768* (2006.01)
*H01L 25/065* (2006.01)
*H01L 25/00* (2006.01)
*H01L 23/00* (2006.01)
*H01L 23/31* (2006.01)
*H01L 23/498* (2006.01)

(52) U.S. Cl.
CPC ............ *H01L 24/06* (2013.01); *H01L 24/11* (2013.01); *H01L 24/13* (2013.01); *H01L 25/0657* (2013.01); *H01L 25/50* (2013.01); H01L 23/3128 (2013.01); H01L 23/49816 (2013.01); H01L 23/49822 (2013.01); *H01L 24/16* (2013.01); H01L 2224/0345 (2013.01); H01L 2224/0401 (2013.01); H01L 2224/05024 (2013.01); H01L 2224/0557 (2013.01); H01L 2224/05166 (2013.01); H01L 2224/05571 (2013.01); H01L 2224/05647 (2013.01); H01L 2224/06182 (2013.01); H01L 2224/11462 (2013.01); H01L 2224/13021 (2013.01); H01L 2224/13082 (2013.01); H01L 2224/13083 (2013.01); H01L 2224/13084 (2013.01); H01L 2224/13111 (2013.01); H01L 2224/13144 (2013.01); H01L 2224/13147 (2013.01); H01L 2224/13155 (2013.01); H01L 2224/13164 (2013.01); H01L 2224/16145 (2013.01); H01L 2224/16225 (2013.01); H01L 2224/16237 (2013.01); H01L 2224/17181 (2013.01); H01L 2224/32145 (2013.01); H01L 2224/32225 (2013.01); H01L 2224/73104 (2013.01); H01L 2224/73204 (2013.01); H01L 2224/81191 (2013.01); H01L 2224/81193 (2013.01); H01L 2225/06513 (2013.01); H01L 2225/06517 (2013.01); H01L 2225/06544 (2013.01); H01L 2924/00011 (2013.01); H01L 2924/00014 (2013.01); H01L 2924/01029 (2013.01); H01L 2924/01322 (2013.01); H01L 2924/12042 (2013.01); H01L 2924/15311 (2013.01); H01L 2924/181 (2013.01)

(58) Field of Classification Search
USPC ....... 257/774, 522, 419, 773, 758, 737, 499, 257/762, 764, 506; 438/303, 591, 618, 438/421, 584, 637, 783, 763, 51, 55, 64, 438/106
See application file for complete search history.

(56) References Cited

U.S. PATENT DOCUMENTS

| | | | |
|---|---|---|---|
| 2006/0071347 A1* | 4/2006 | Dotta | H01L 21/486 257/781 |
| 2006/0131721 A1* | 6/2006 | Ito | 257/689 |
| 2007/0023875 A1* | 2/2007 | Okane | H01L 23/49575 257/666 |
| 2008/0290491 A1* | 11/2008 | Yamano et al. | 257/686 |
| 2008/0303170 A1* | 12/2008 | Tanida | H01L 21/76898 257/774 |
| 2009/0008765 A1* | 1/2009 | Yamano | H01L 21/6835 257/690 |
| 2009/0053459 A1* | 2/2009 | Hirose | H05K 1/112 428/76 |
| 2010/0320594 A1* | 12/2010 | Yamano | H01L 21/561 257/693 |
| 2012/0049349 A1* | 3/2012 | Lee | H01L 21/76898 257/737 |

FOREIGN PATENT DOCUMENTS

| | | |
|---|---|---|
| JP | 2006-179562 A | 7/2006 |
| JP | 2007-180303 | 7/2007 |
| WO | WO 2006/080337 A1 | 8/2006 |

OTHER PUBLICATIONS

Office Action from related Japanese Application No. 2013-028828, dated Apr. 23, 2013, pp. 1-2.

* cited by examiner

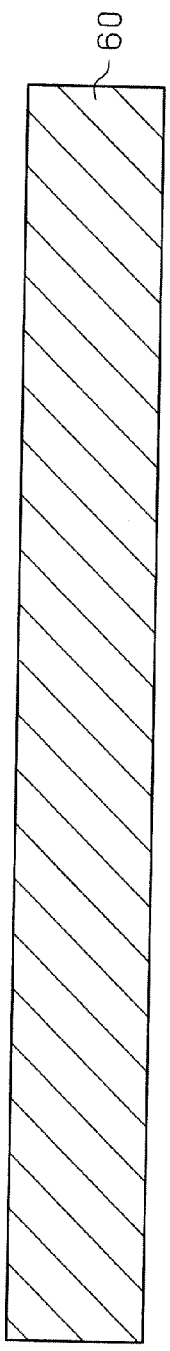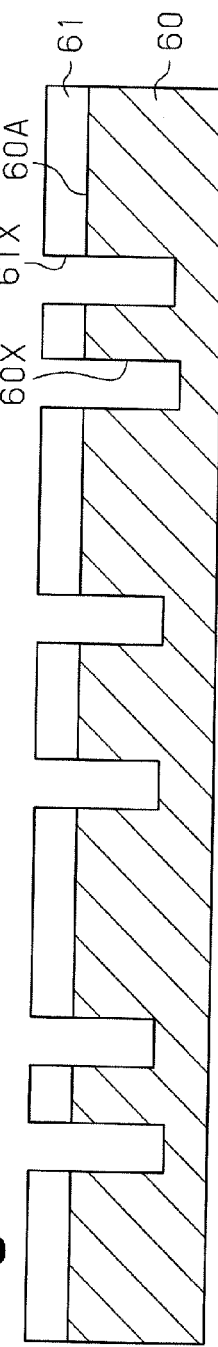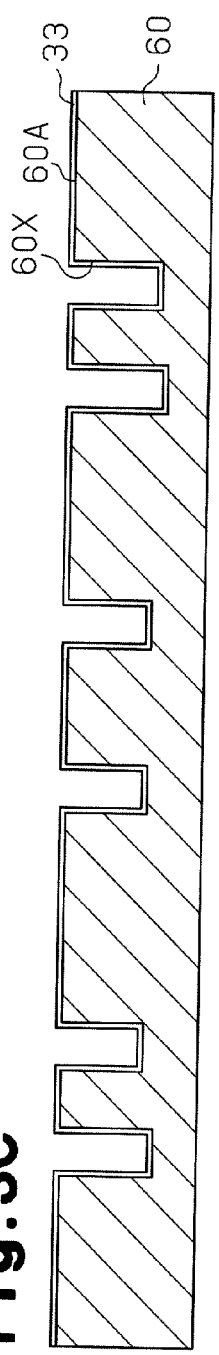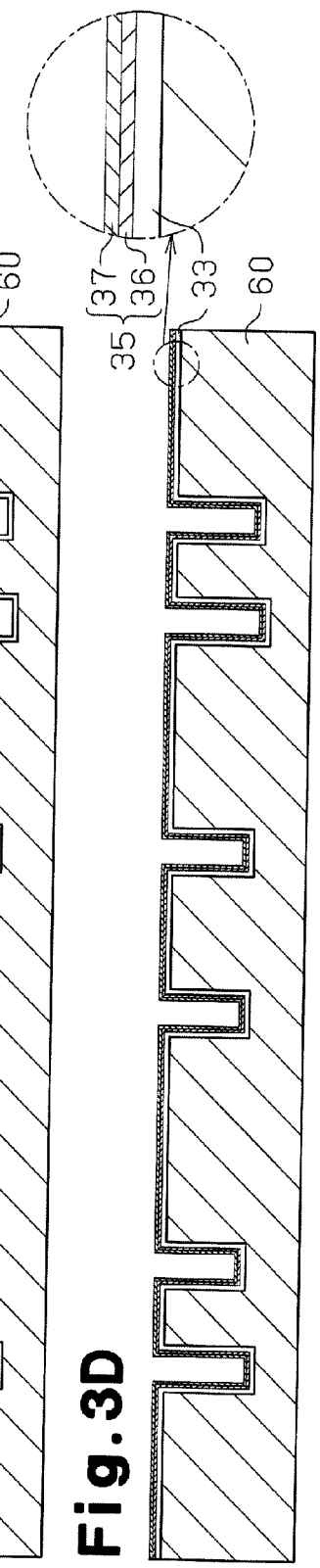

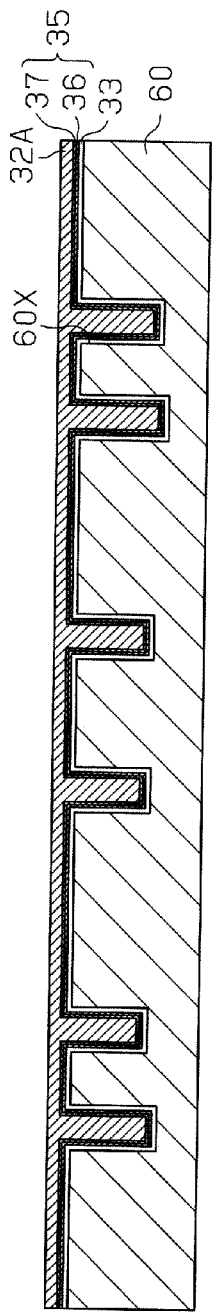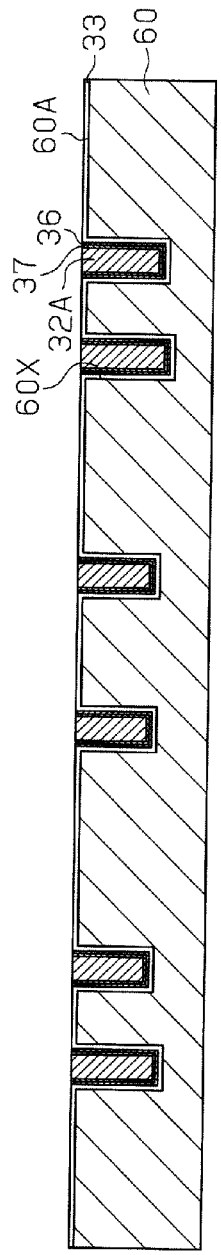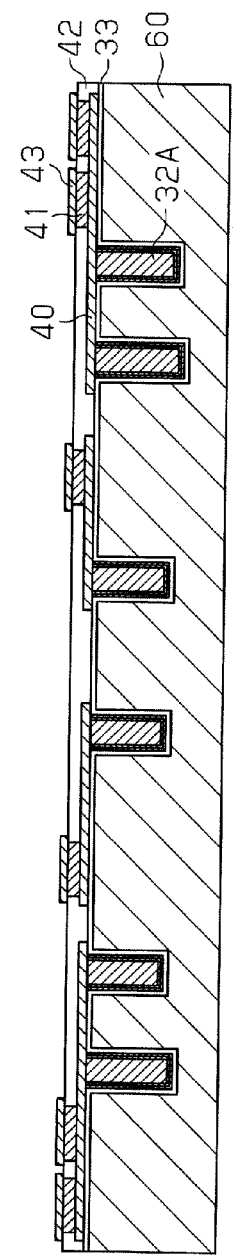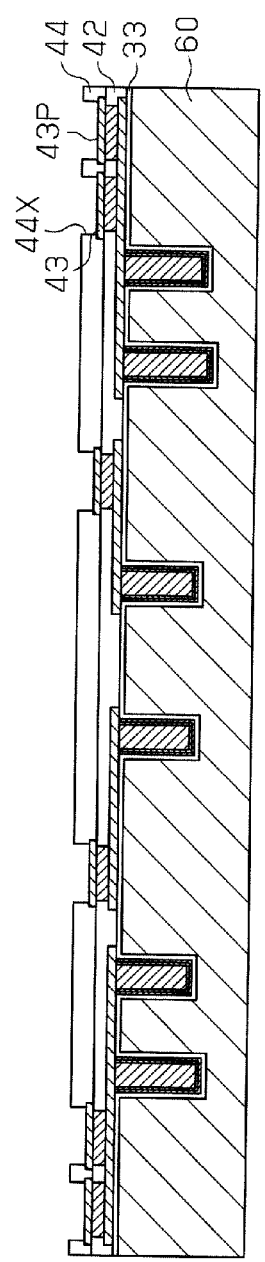

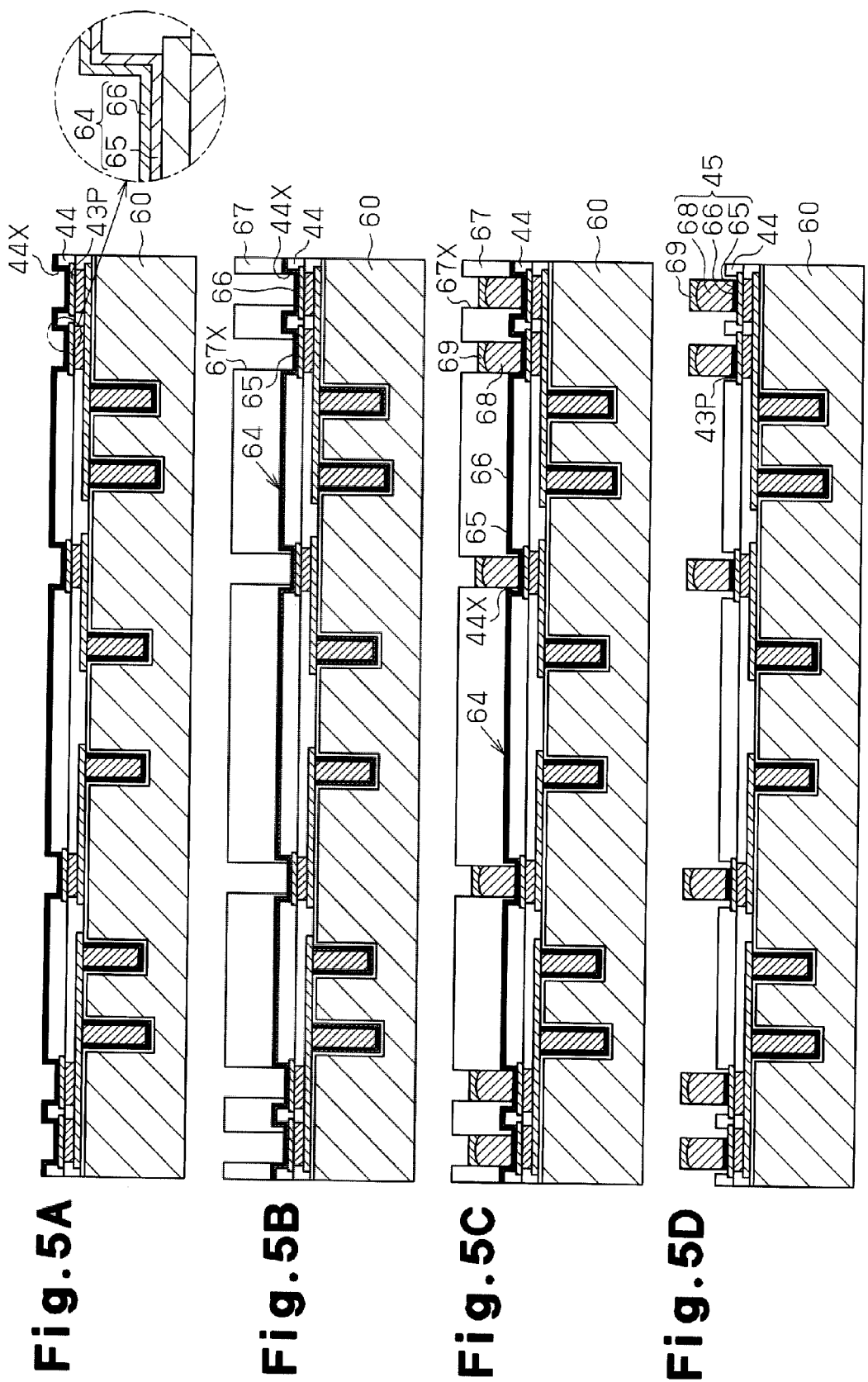

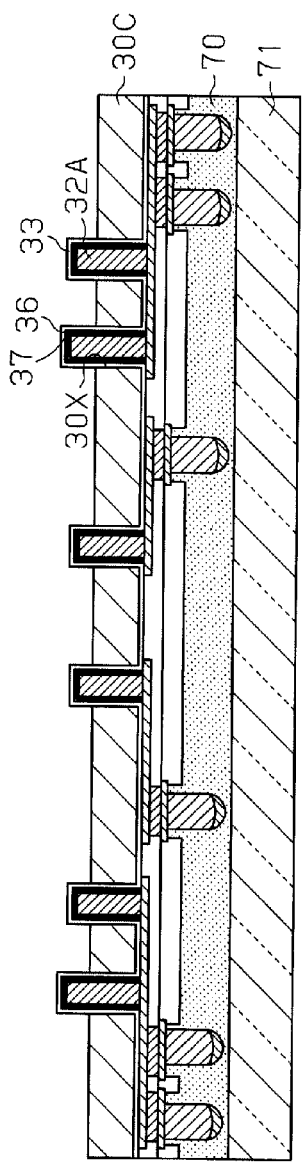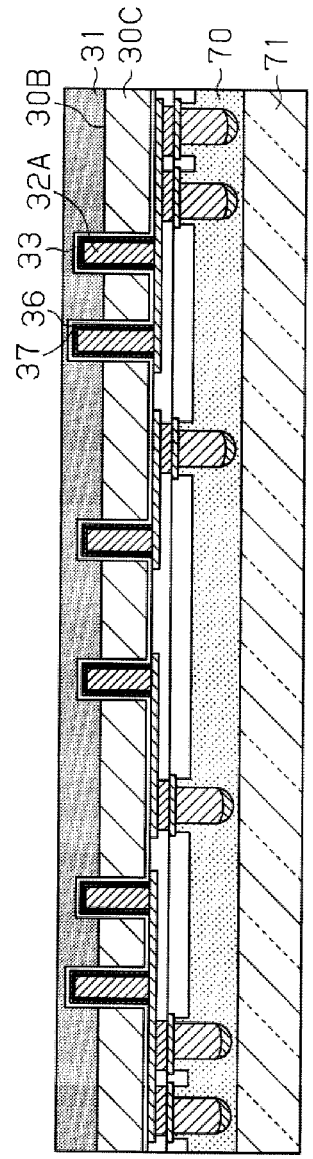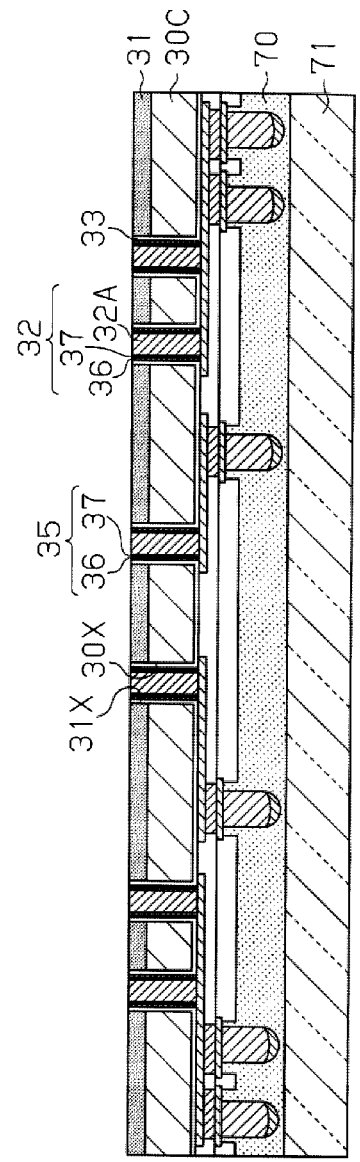

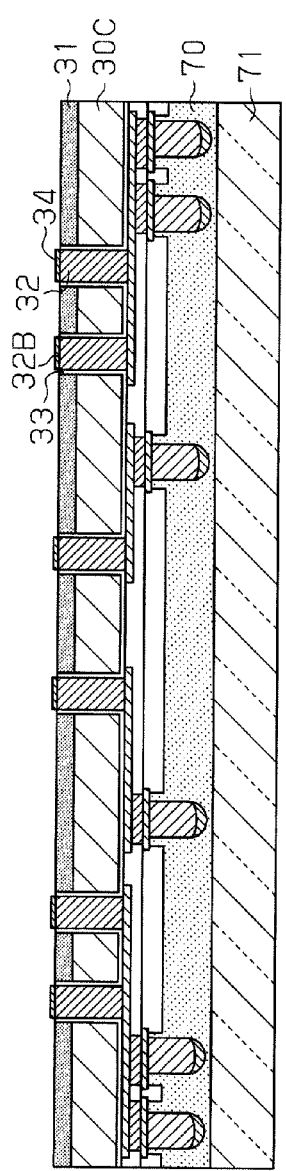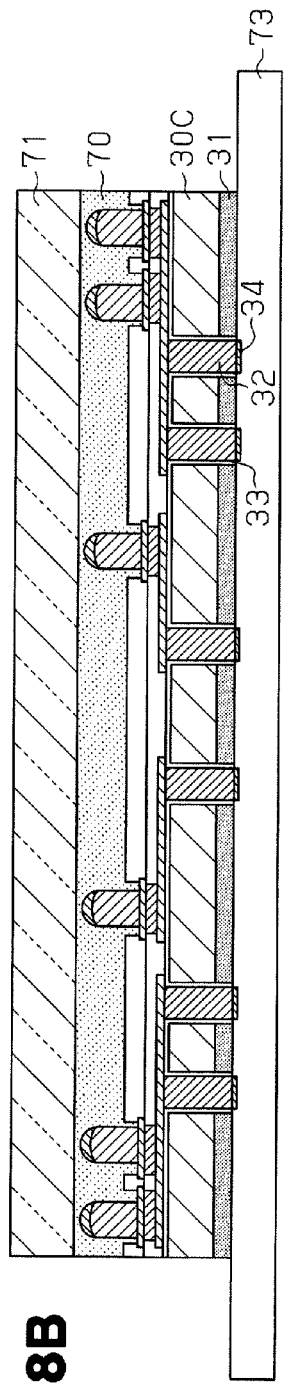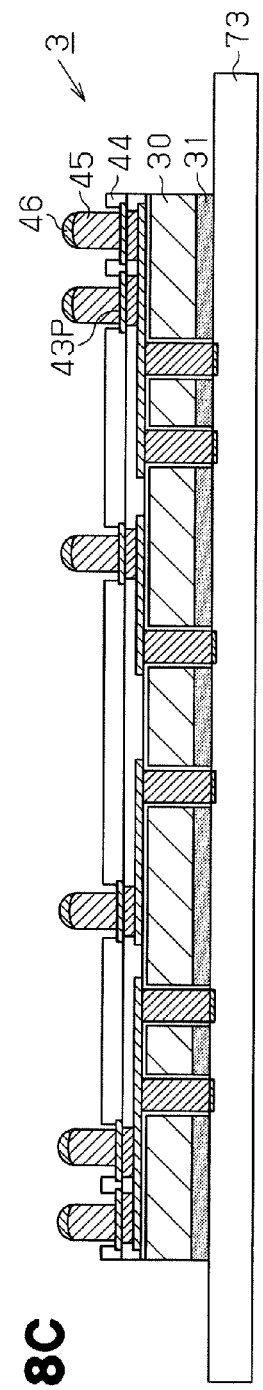

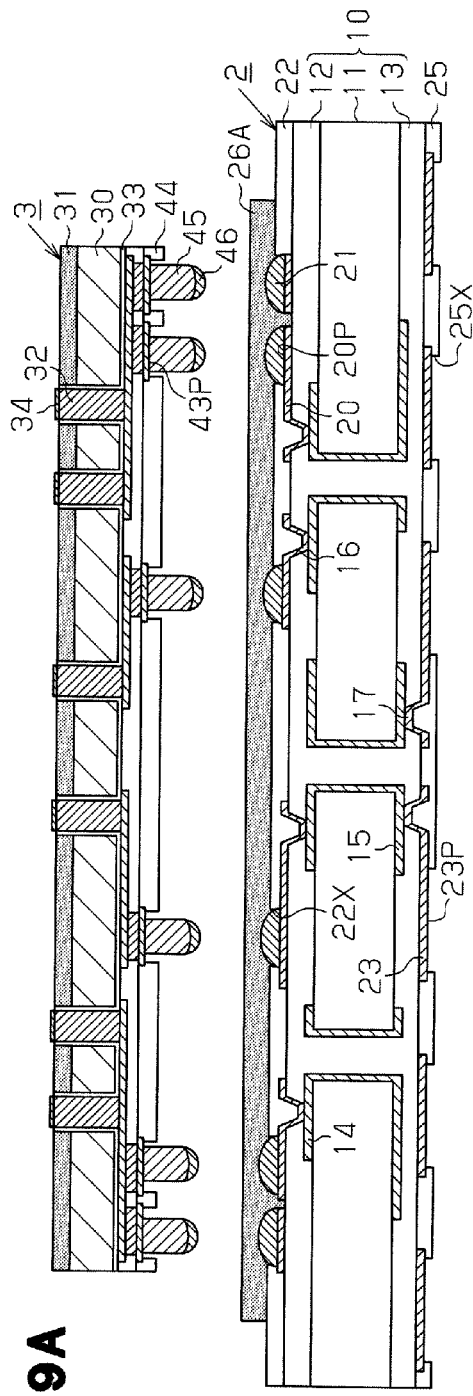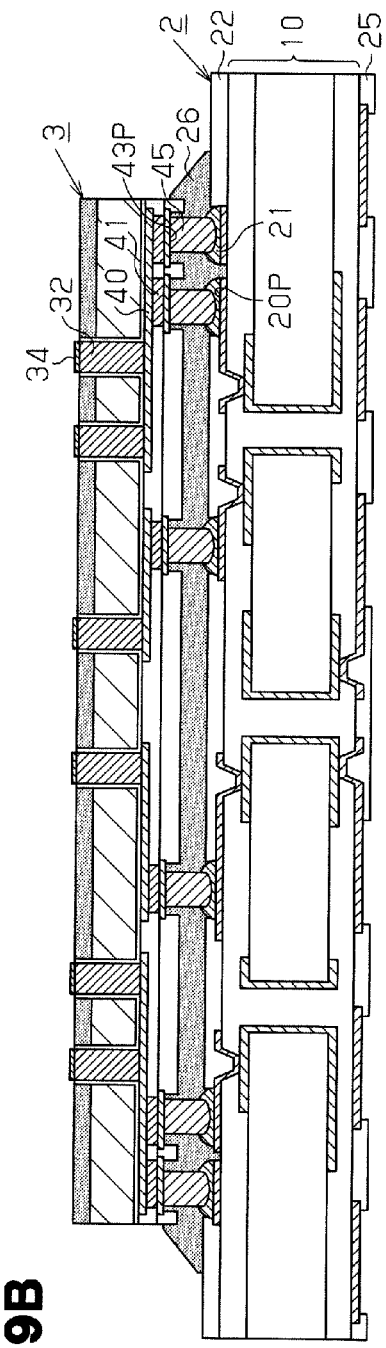

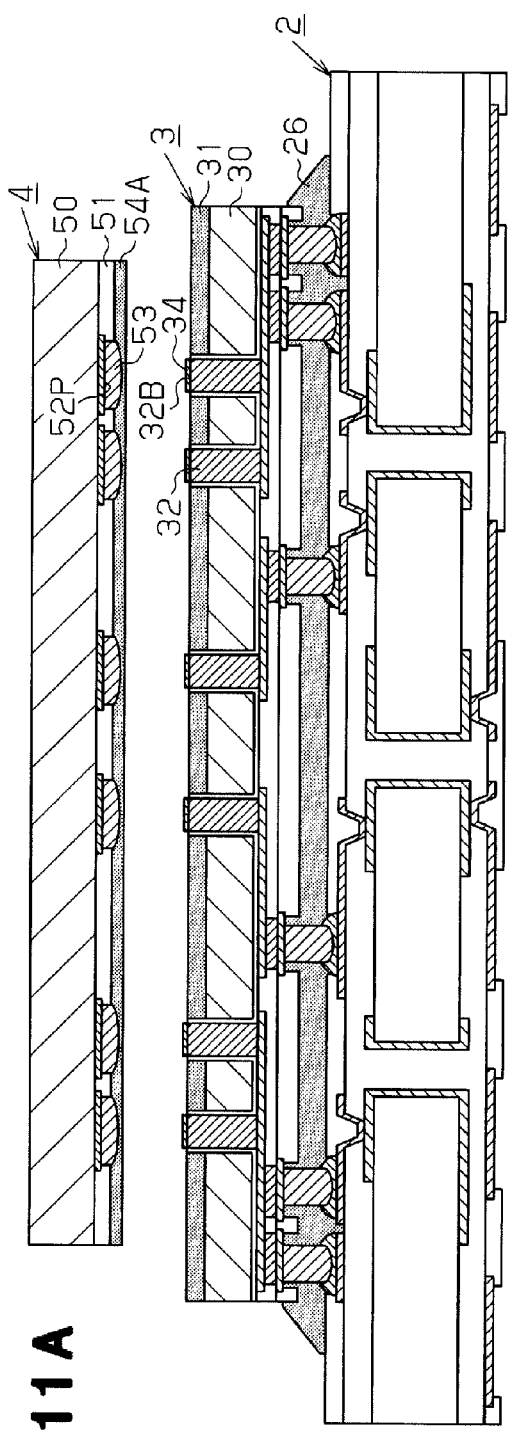
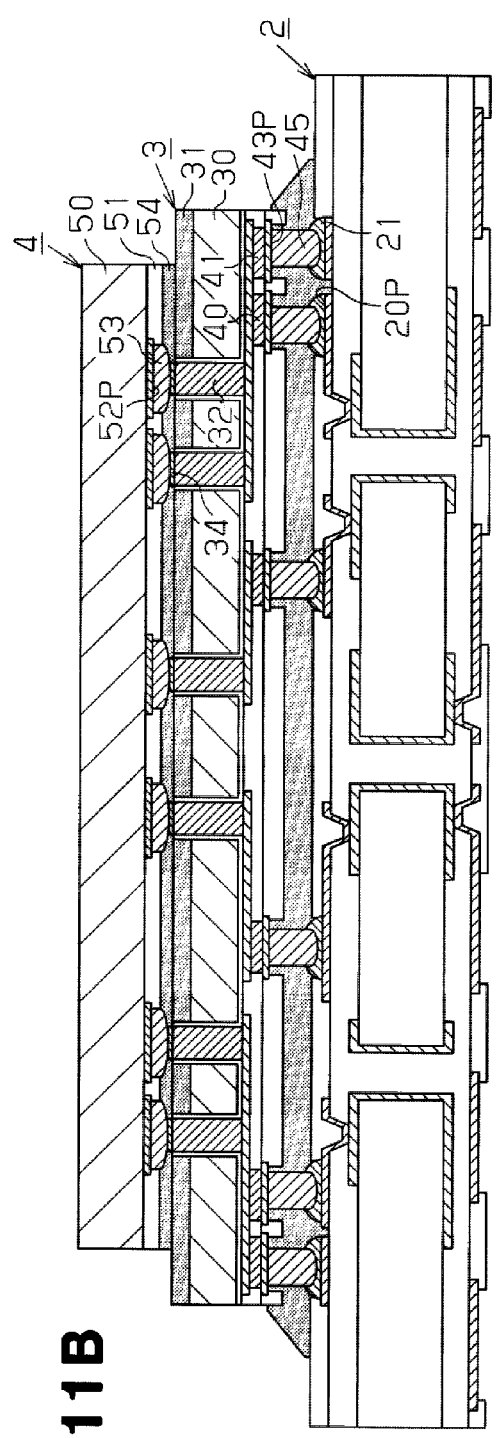

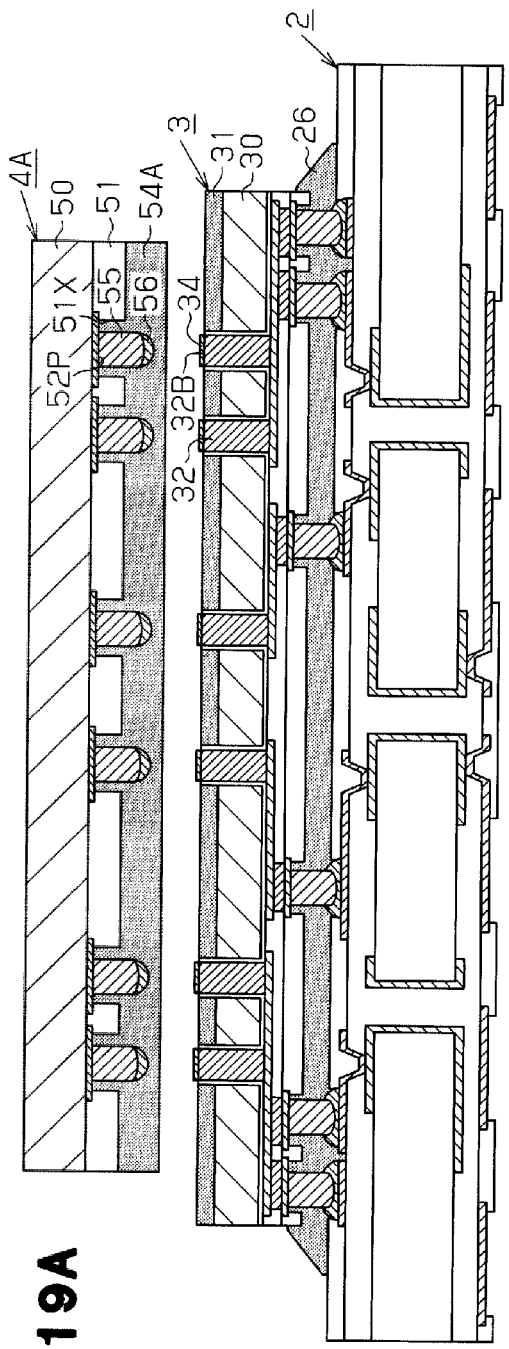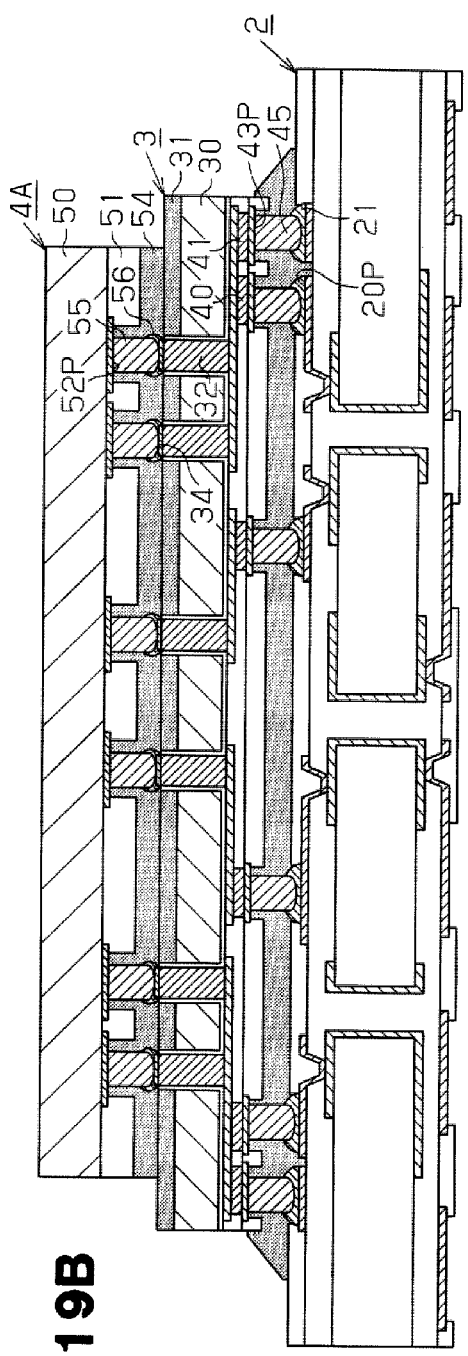
Fig.19A
Fig.19B

SEMICONDUCTOR DEVICE, SEMICONDUCTOR PACKAGE, METHOD FOR MANUFACTURING SEMICONDUCTOR DEVICE, AND METHOD FOR MANUFACTURING SEMICONDUCTOR PACKAGE

CROSS-REFERENCE TO RELATED APPLICATIONS

This application is based upon and claims the benefit of priority from prior Japanese Patent Application Nos. 2011-175197, filed on Aug. 10, 2011 and 2011-270410, filed on Dec. 9, 2011, the entire contents of which are incorporated herein by reference.

FIELD

This disclosure relates to a semiconductor device, a semiconductor package, a method for manufacturing a semiconductor device, and a method for manufacturing a semiconductor package.

BACKGROUND

Electronic devices are required to be more compact and include more sophisticated functions. As a result, semiconductor devices (chips), such as ICs and LSIs, used in such electronic devices have a higher level of integration and are provided with a higher capacity. Further, packages on which semiconductor chips are mounted are required to be smaller (thinner), include more pins, and have a higher density. To meet such requirements, a system in package (SiP) has been put to practical use. The SiP mounts a plurality of semiconductor chips on a single substrate. In particular, an SiP using three-dimensional mounting technology that stacks semiconductor chips three-dimensionally, or a so-called chip-stacked type package, allows for a higher level of integration and is thus advantageous. In addition, the chip-stacked type package allows the wiring length to be shortened. This allows the circuit operation speed to be increased and stray capacitance in the wiring to be decreased and is thereby advantageous and widely used.

As the three-dimensional mounting technology used to manufacture such a chip-stacked type package, a known technique stacks semiconductor chips on a substrate and electrically connects electrodes of the semiconductor chips to electrodes of the substrate through wire bonding. However, in such a structure, fine wires are used to electrically connect the semiconductor chip to the substrate. This increases impedance. As a result, the package may not be applicable to high-speed semiconductor chips. Further, a region used for the formation of a wire loop is required to be arranged in the package. This enlarges the package.

A different three-dimensional mounting technique for manufacturing a chip-stacked package stacks semiconductor chip, which include through electrodes, on a substrate, and electrically connects the semiconductor chips with the through electrodes (refer to, for example, Japanese Laid-Open Patent Publication No. 2006-179562). This technique allows for a shorter wiring length than the wire bonding technique and thereby allows for the package to be miniaturized.

SUMMARY

When semiconductor chips are stacked on a substrate, voids are apt to forming in an underfill that is filled between semiconductor chips. In particular, when using through electrodes to electrically connect semiconductor chips, which are stacked as described above, the gaps between the semiconductor chips become extremely narrow. This makes it difficult for the underfill to evenly enter the gaps between the semiconductor chips. Thus, voids are apt to forming in the gaps. When such voids are formed in the underfill, an increase in the temperature of the package during, for example, a reflow process will expand the gas in the voids. Such gas expansion produces cracks between the semiconductor chips and decreases the reliability of the electrical connection between semiconductor chips.

According to one aspect of this disclosure, a semiconductor device is provided. A semiconductor substrate includes a first surface, a second surface located opposite to the first surface, and a through hole that extends through the semiconductor substrate from the first surface to the second surface. An insulative layer includes a first surface, a second surface located opposite to the first surface of the insulative layer to cover the first surface of the semiconductor substrate, and an opening aligned with the through hole. An insulative film covers an inner wall surface of the through hole and the opening. A through electrode is formed in the through hole and the opening inward from the insulative film. The through electrode includes a first end surface that forms a pad exposed from the first surface of the insulative layer. The first end surface of the through electrode is flush with the first surface of the insulative layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 3A to 3D are schematic cross-sectional views showing procedures for manufacturing the semiconductor chip in the first embodiment;

FIGS. 4A to 4D are schematic cross-sectional views showing procedures for manufacturing the semiconductor chip in the first embodiment;

FIGS. 5A to 5D are schematic cross-sectional views showing procedures for manufacturing the semiconductor chip in the first embodiment;

FIGS. 7A to 7C are schematic cross-sectional views showing procedures for manufacturing the semiconductor chip in the first embodiment;

FIGS. 8A to 8C are schematic cross-sectional views showing procedures for manufacturing the semiconductor chip in the first embodiment;

FIGS. 9A and 9B are schematic cross-sectional views showing procedures for manufacturing the semiconductor package of the first embodiment;

FIGS. 11A and 11B are schematic cross-sectional views showing procedures for manufacturing the semiconductor package of the first embodiment;

FIGS. 19A and 19B are schematic cross-sectional views showing procedures for manufacturing a semiconductor package in a modified example.

DESCRIPTION OF THE EMBODIMENTS

Embodiments will hereafter be described with reference to the drawings. The accompanying drawings schematically illustrate structures and do not necessarily depict actual scale. Further, to facilitate understanding of the cross-sectional structure, some components may be shown without resin hatching lines.

First Embodiment

A first embodiment will now be described with reference to FIGS. 1 to 12.

Figure 1:
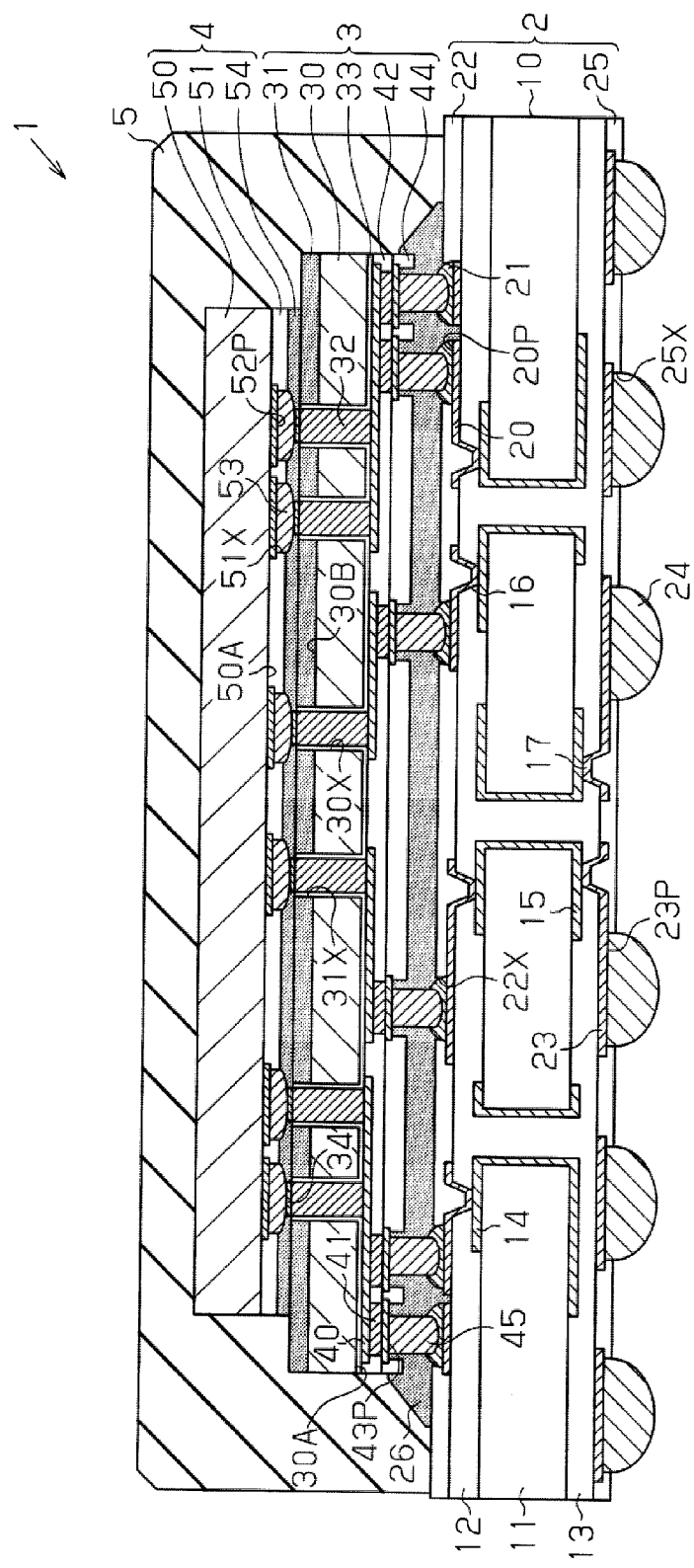
FIG. 1 is a schematic cross-sectional view of a semiconductor package according to a first embodiment.

As shown in FIG. 1, the semiconductor package 1 includes a wiring substrate 2, a semiconductor chip 3 mounted on the wiring substrate 2, a semiconductor chip 4 stacked on the semiconductor chip 3, and an encapsulation resin 5 sealing the semiconductor chips 3 and 4 stacked on the wiring substrate 2. Each of the semiconductor chips 3 and 4 are examples of a first semiconductor device. The semiconductor chip 4 is an example of a second semiconductor device. The semiconductor package 1 is a so-called chip-stacked type package. A semiconductor chip for a logic device, such as a CPU or an MPU, may be used as the semiconductor chip 3. A semiconductor chip for a memory device, such as a DRAM or an SDRAM, may be used as the semiconductor chip 4. In the description hereafter, the semiconductor chip 3 stacked at the first stage is also referred to as the lower chip, and the semiconductor chip 4 stacked at the second stage is also referred to as the upper chip 4.

The encapsulation resin 5 is arranged on the wiring substrate 2 to seal the lower chip 3 and the upper chip 4. An insulative resin, such as an epoxy resin or a polyimide resin, may be used as the material of the encapsulation resin 5. The insulative resin does not have to be in a liquid form and may be in a tablet form or a powder form. To apply the encapsulation resin 5, transfer molding, compression molding, injection molding, potting, and the like may be performed. A printing process may also be performed to apply a paste of resin and form the encapsulation resin 5.

[Structure of Wiring Substrate]

The structure of the wiring substrate 2 will now be described.

The wiring substrate 2 includes a substrate body 10, an uppermost layer wiring pattern 20, a solder resist layer 22, a lowermost layer wiring pattern 23, and a solder resist layer 25.

The substrate body 10 includes a core substrate 11, insulative layers 12 and 13 stacked on the core substrate 11, and wires 14 and 15 and vias 16 and 17 formed in the insulative layers 12 and 13. The wires 14 and 15 and the vias 16 and 17 electrically connect the wiring patterns 20 and 23. The wires 14 and 15 and the vias 16 and 17 may be formed from, for example, copper (Cu). An insulative resin, such as an epoxy resin or a polyimide resin, may be used as the material of the insulative layers 12 and 13.

The wiring pattern 20 is arranged on a mounting surface of the wiring substrate 2 on which the lower chip 3 and the upper chip 4 are mounted (in FIG. 1, the upper side of the substrate body 10). The wiring pattern 20 includes electrode pads 20P. The wiring pattern 20 may be formed from, for example, copper.

A connection terminal 21 is formed on each electrode pad 20P. A presolder or metal layer (surface-protection layer) may be used as the connection terminal. The material of the presolder may be, for example, eutectic solder, lead (Pb)-free solder (tin (Sn)-silver (Ag), Sn—Cn, Sn—Ag—Cu and the like). Further, the material of the surface-protection layer may be, for example, a tin layer, a gold (Au) layer, a nickel (Ni)/Au layer (metal layer formed by applying a nickel layer and gold layer in this order to the pad 20P), an Ni/palladium (Pd)/Au layer (metal layer formed by applying a nickel layer, a palladium layer, and a gold layer in this order to the pad 20P), or a Pd/Au layer (metal layer formed by applying a palladium layer and a gold layer in this order to the pad 20P).

The solder resist layer 22 is arranged at the upper side of the substrate body 10 to partially cover the wiring pattern 20. The solder resist layer 22 includes a plurality of openings 22X exposing parts of the wiring pattern 20 as the electrode pads 20P. An insulative resin, such as an epoxy resin or a polyimide resin, may be used as the material of the solder resist layer 22.

The wiring pattern 23 is arranged at the lower side of the substrate body 10. The wiring pattern 23 includes external connection pads 23P for external connection terminals 24, such as solder balls or lead pins, used to mount the wiring substrate 2 on a mounting substrate such as a mother board. The external connection pads 23P are formed by exposing parts of the wiring pattern 23 from the openings 25X of the solder resist layer 25 formed at the lower side of the substrate body 10. The wiring pattern 23 may be formed from, for example, copper. The wiring pattern 23 may also be formed by applying a certain plating (e.g., nickel plating or gold plating) to the surface of a copper layer. An insulative resin, such as an epoxy resin or a polyimide resin, may be used as the material of the solder resist layer 25.

An insulative layer 26 is formed between the wiring substrate 2 and the lower chip 3 mounted on the wiring substrate 2. The insulative layer 26 increases the connection strength of the electrode pads 20P of the wiring substrate 2 and the connection terminals 45 of the lower chip 3. The insulative layer 26 also suppresses corrosion of the wiring pattern 20 and the occurrence of electromigration. Accordingly, the insulative layer 26 functions to prevent the reliability of the wiring pattern 20 from decreasing. An insulative resin, such as an epoxy resin or a polyimide resin, may be used as the material of the insulative layer 26. More specifically, an adhesive film of insulative resin (e.g., non-conductive film (NCF)), a paste of insulative resin (e.g., non-conductive paste (NCP)), a built-up resin (epoxy resin including filler), and a liquid crystal polymer may be used as the material of the insulative layer 26. Further, an adhesive film of an anisotropic conductive resin, such as an anisotropic conductive film (ACF), or a paste of an anisotropic conductive resin, such as an anisotropic conductive paste (ACP), may be used as the material of the insulative layer 26. Here, ACP and ACF are obtained by dispersing resin pellets coated with Ni/Au in an insulative resin of which base in epoxy resin or cyanate ester resin. Further, ACP and ACF are conductive in a vertical direction and insulative in a horizontal direction. The insulative layer 26 has a thickness set to, for example, approximately 10 to 100 μm.

In this manner, in the semiconductor package 1 of the first embodiment, the wiring substrate 2 functions as an interposer that connects the semiconductor chips 3 and 4 to a mounting substrate (not shown) such as a mother board. The wiring patterns 20 and 23 forming the outermost layers need only be electrically connected to each other through the wiring substrate 2. Thus, the structure of the substrate body 10 at the inner sides of the wiring patterns 20 and 23 is not particularly limited. For example, a wiring layer does not have to be formed in the substrate body 10. Further, instead of a cored built-up substrate including the core substrate 11, the substrate body 10 may be a coreless substrate that does not include the core substrate 11.

[Structure of Lower Chip]

The structure of the lower chip 3 will now be described.

The lower chip 3 includes a semiconductor substrate 30, an insulative layer 31, through electrodes 32, an insulative film 33, a wiring pattern 40, vias 41, an insulative layer 42, electrode pads 43P, a protective film 44, and connection terminals 45. The lower chip 3 is flip-chip bonded to the wiring substrate 2.

The semiconductor substrate 30 includes a first surface 30B (upper surface in FIG. 1) and a second surface 30A (lower surface in FIG. 1) located opposite to the first surface 30B. A semiconductor integrated circuit (not shown) is formed on the second surface 30A of the semiconductor substrate 30. The semiconductor integrated circuit includes a diffusion layer formed in the semiconductor substrate 30, an insulative layer stacked on the semiconductor substrate 30, and vias, wires, and the like arranged on the stacked insulative layer. The semiconductor substrate 30 includes inner wall surfaces defining through holes 30X extending through the semiconductor substrate 30 from the first surface 30B to the second surface 30A at certain locations. The semiconductor substrate 30 is formed from, for example, silicon (Si). The semiconductor substrate 30 may have a thickness of, for example, approximately 30 to 200 μm. The semiconductor substrate 30 is, for example, a segment of a thin Si wafer.

Figure 2:
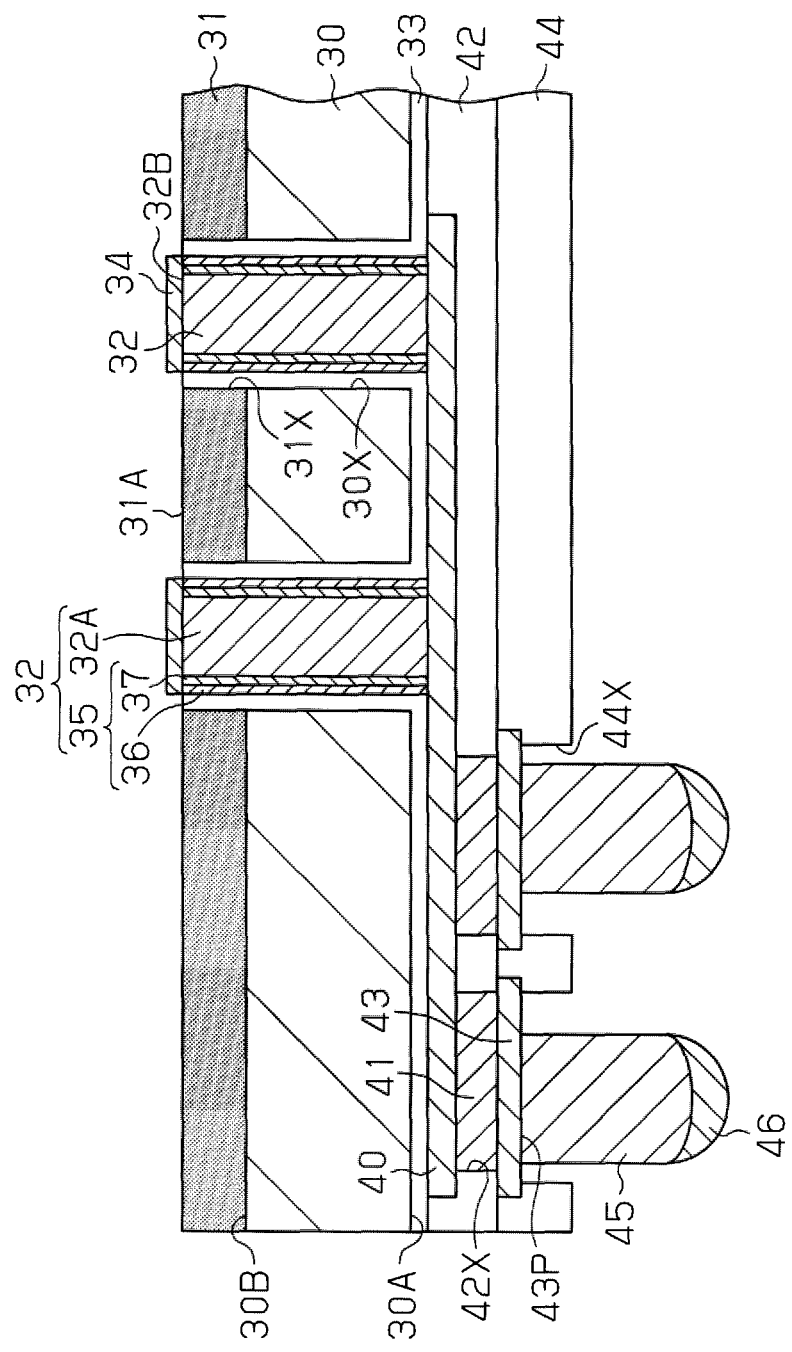
FIG. 2 is an enlarged cross-sectional view of a semiconductor chip in the first embodiment.

Referring to FIG. 2, the insulative layer 31 (first insulative layer) includes a first surface 31A (upper surface in FIG. 2) and a second surface, which is located opposite to the first surface 31A and covers the first surface 30B (surface at the side the upper chip 4 is stacked) of the semiconductor substrate 30. The insulative layer 31 includes inner wall surfaces defining openings 31X aligned with the through holes 30X. Each opening 31X, which is in communication with the corresponding through hole 30X, has substantially the same diameter as the through hole 30X. An insulative resin, such as an epoxy resin or a polyimide resin, may be used as the material of the insulative layer 31. More specifically, an adhesive film of insulative resin (e.g., NCF), a paste of insulative resin (e.g., NCP), a built-up resin (epoxy resin including filler), and a liquid crystal polymer may be used as the material of the insulative layer 31. The insulative layer 31 may have a thickness of, for example, approximately 10 to 50 μm.

The insulative film 33 is formed to cover the second surface 30A of the semiconductor substrate 30, the inner wall surfaces of the semiconductor substrate 30 defining the through holes 30X, and the inner wall surfaces of the insulative layer 31 defining the openings 31X. For example, a silicon oxide film or a silicon nitride film may be used as the insulative film 33. The insulative film 33 has a thickness of, for example, approximately 0.5 to 1.0 μm.

The through electrodes 32 fill the through holes 30X and the openings 31X inward from the insulative film 33. Each through electrode 32 has a bottom surface that is substantially flush with the lower surface of the insulative film 33, which covers the second surface 30A of the semiconductor substrate 30. The bottom surface of the through electrode 32 is electrically connected to the wiring pattern 40.

Further, as shown in FIG. 2, each through electrode 32 includes a top surface 32B (first end surface) that is substantially flush with the first surface 31A (surface opposite to the surface contacting the semiconductor substrate 30) of the insulative layer 31, which covers the first surface 30B of the semiconductor substrate 30. The top surface 32B of the through electrode 32 functions as a pad when the upper chip 4 is stacked on the lower chip 3. The through electrode 32 is pillar-shaped and has a diameter of, for example, 10 to 20 μm. The through electrodes 32 are arranged at a pitch of, for example, 40 to 100 μm.

A connection terminal 34 is formed on the top surface 32B of each through electrode 32. The connection terminal 34 may be formed by a tin (Sn) layer, an Au layer, an Ni/Au layer (metal layer formed by applying an Ni layer and an Au layer in this order to the surface 32B), a Pd/Au layer (metal layer formed by applying a Pd layer and an Au layer in this order to the surface 32B), or an Ni/Pd/Au layer (metal layer formed by applying an Ni layer, a Pd layer, and an Au layer in this order to the surface 32B). When the connection terminal 34 is an Ni/Au layer, the Ni layer may have a thickness of, for example, 0.1 to 3.0 μm, and the Au layer may have a thickness of, for example, approximately 0.001 to 1.0 μm.

The insulative film 33 is formed to entirely cover the inner wall surfaces of the semiconductor substrate 30 defining the through holes 30X and the inner wall surfaces of the insulative layer 31 defining the openings 31X. A seed layer 35 is formed to entirely cover the inner wall surfaces of the insulative film 33 in the through holes 30X and the openings 31X. In the first embodiment, the seed layer 35 is a laminated film including a metal film 36, which is formed by tantalum nitride (TaN), and a metal film 37, which is formed from copper (Cu). A conductive layer 32A fills a space formed inward from the seed layer 35 (metal film 37) in each through hole 30X and the corresponding opening 31X. The conductive layer 32A and the seed layer 35 (metal film 36 and metal film 37) form the through electrode 32. In the seed layer 35, the outer metal film 36 functions as a metal barrier layer that suppresses the dispersion of copper to the insulative film 33 from the inner metal film 37 (Cu film) and from the conductive layer 32A. In addition to TaN, tantalum (Ta), chromium (Cr), and titanium (Ti) may be used as the metal material functioning as the metal barrier layer. The conductive layer 32A may be formed from, for example, copper or a copper alloy.

The wiring pattern 40 is formed on the lower surface of the insulative film 33 that covers the second surface 30A of the semiconductor substrate 30. The wiring pattern 40 includes a first end portion connected to the bottom surface of a through electrode 32 and a second end portion connected by a via 41 to an electrode pad 43P. Thus, the wiring pattern 40 and the via 41 electrically connect the through electrode 32 and the electrode pad 43P. The wiring pattern 40 and the via 41 may be formed from, for example, copper or copper alloy.

The insulative layer 42 is formed to cover the wiring pattern 40. The insulative layer 42 includes openings 42X exposing parts of the wiring pattern 40. Each opening 42X includes the via 41. The insulative layer 42 may be formed by, for example, a low dielectric material (so-called low-k material) having a low dielectric constant. One example of a low dielectric material is SiOC. Other examples of a low dielectric material are SiOF and organic polymers. The insulative layer 42 may have a dielectric constant of, for example, approximately, 3.0 to 3.5. The insulative layer 42 has a thickness of, for example, 0.5 to 2 µm.

A wiring layer 43 is formed on the lower surfaces of the vias 41. The wiring layer 43 is formed to cover the vias 41. The wiring layer 43 may be formed from, for example, aluminum. For example, an alloy of Cu and Al or an alloy of Cu, Al, and Si may be used as the material of the wiring layer 43.

The protective film 44 is formed on the lower surface of the insulative layer 42 to cover the lower surface of the insulative layer 42 and parts of the wiring layer 43. Further, the protective film 44 includes a plurality of openings 44X, which expose parts of the wiring layer 43 as the electrode pads 43P. The protective film 44 protects a semiconductor integrated circuit (not shown) formed on the second surface 30A of the semiconductor substrate 30 and may also be referred to as a passivation film. Further, the protective film 44 may be formed by laminating a layer of a SiN film or a PSG film with a layer of polyimide.

The connection terminals 45 are formed on the electrode pads 43P. The connection terminals 45 are electrically connected to the through electrodes 32 and electrically connected to the semiconductor integrated circuit (not shown). Each connection terminal 45 is a pillar-shaped connection bump extending downward from the lower surface of the corresponding electrode pad 43P. The connection terminals 45 are formed at positions corresponding to the electrode pads 20P of the wiring substrate 2. Referring to FIG. 1, in a state in which the lower chip 3 is mounted on the wiring substrate 2, the connection terminals 45 are electrically connected to the electrode pads 20P. Each connection terminal 45 has a height of, for example, 20 to 40 µm and a diameter of, for example, 10 to 40 µm. The connection terminals 45 may be formed from, for example, copper.

As shown in FIG. 2, a metal layer 46 is formed on the lower surfaces of the connection terminals 45. The metal layer 46 may be formed by an Au layer, an Ni/Au layer (metal layer formed by applying an Ni layer and an Au layer in this order to the connection terminals 45), a Pd/Au layer (metal layer formed by applying a Pd layer and an Au layer in this order to the connection terminals 45), or an Ni/Pd/Au layer (metal layer formed by applying an Ni layer, a Pd layer, and an Au layer in this order to the connection terminals 45). Further, for example, a solder plating of a lead-free solder (Sn—Ag or the like) may be used as the metal layer 46.

[Structure of Upper Chip]

The structure of the upper chip 4 will now be described with reference to FIG. 1.

The upper chip 4 includes a semiconductor substrate 50, a protective film 51, electrode pads 52P, connection terminals 53, and an insulative layer 54. The upper chip 4 is flip-chip bonded to the lower chip 3.

The semiconductor substrate 50 includes a first surface 50A (lower surface in FIG. 1) on which a semiconductor integrated circuit is formed. The semiconductor integrated circuit includes a dispersion layer formed in the semiconductor substrate 50, an insulative layer stacked on the semiconductor substrate 50, and vias and wires arranged on the stacked insulative layer. The semiconductor substrate 50 is formed from, for example, silicon (Si). The semiconductor substrate 50 may have a thickness of, for example, approximately 30 to 200 µm. The semiconductor substrate 50 is a segment of a thin Si wafer.

The protective film 51 is formed on the first surface 50A of the semiconductor substrate 50. Further, the protective film 51 includes a plurality of openings 51X, which expose the electrode pads 52P. The protective film 51 protects the semiconductor integrated circuit (not shown) formed on the first surface 50A of the semiconductor substrate 50 and may also be referred to as a passivation film. For example, a SiN film, a PSG film, or the like may be used as the protective film 51. Further, the protective film 51 may be formed by laminating a layer of a SiN film or a PSG film with a polyimide layer.

The electrode pads 52P are electrically connected to the semiconductor integrated circuit (not shown). The electrode pads 52P are formed at positions corresponding to the through electrodes 32 of the lower chip 3. As shown in FIG. 1, in a state in which the upper chip 4 is stacked on the lower chip 3, the electrode pads 52P are electrically connected to the through electrodes 32 (connection terminals 34). Further, the through electrodes 32 and the like electrically connect the electrode pads 52P to the electrode pads 20P of the wiring substrate 2. The electrode pads 52P are exposed from the openings 51X of the protective film 51. The electrode pads 52P may be formed from, for example, aluminum (Al). Further, for example, an alloy of Cu and Al or an alloy of Cu, Al, and Si may be used as the material of the electrode pads 52P.

The connection terminals 53 are formed on the electrode pads 52P. The connection terminals 53 are electrically connected by the electrode pads 52P to the semiconductor integrated circuit (not shown). Further, as shown in FIG. 1, in a state in which the upper chip 4 is stacked on the lower chip 3, the connection terminals 53 are electrically connected to the through electrodes 32 by the connection terminals 34 of the semiconductor chip 3. In this manner, the through electrodes 32, which are formed in the lower chip 3, electrically connect the lower chip 3 and the upper chip 4.

The connection terminals 53 may be formed by an Ni/Au/Sn layer (metal layer formed by applying an Ni layer, an Au layer, and an Sn layer in this order to the pads 52P) or an Ni/Pd/Au/Sn layer (metal layer formed by applying an Ni layer, a Pd layer, an Au layer, and an Sn layer in this order to the pads 52P). Further, the connection terminals 53 may be formed by an Ni/Au layer (metal layer formed by applying an Ni layer and an Au layer in this order to the pads 52P) or an Ni/Pd/Au layer (metal layer formed by applying an Ni layer, a Pd layer, and an Au layer in this order to the pads 52P). The connection terminals 53 (metal layers) may be formed by performing, for example, Al zincate processing or electroless plating. In the same manner as the connection terminals 45 of the lower chip 3 and the metal layer 46, the connection terminals 53 may be formed by pillar-shaped connection bumps and a solder layer. In this case, for example, a Cu layer may be used to form the connection bumps, and lead-free solder may be used as the material of the solder layer.

In a state in which the upper chip 4 is stacked on the lower chip 3, the insulative layer 54 is formed on the lower surface of the protective film 51 to cover the connection terminals 53 of the upper chip 4 and the connection terminals 34 and through electrodes 32 of the lower chip 3. The insulative layer 54 increases the connection strength of the connection terminals 34 of the lower chip 3 and the connection terminals 53 of the upper chip 4. The insulative layer 54 also suppresses corrosion of the through electrodes 32 and the occurrence of electromigration. Accordingly, the insulative layer 54 functions to prevent the reliability of the through electrodes 32 from decreasing. An insulative resin that is used has the same composition as the insulative layer 31 contacting the insulative layer 54 in a state in which the upper chip 4 is stacked on the lower chip 3, that is, the insulative layer 31 formed at the uppermost layer of the lower chip 3. In other words, an insulative resin, such as an epoxy resin or a polyimide resin, may be used as the material of the insulative layer 54. More specifically, for example, an adhesive film of insulative resin (e.g., NCF), a paste of insulative resin (e.g., NCP), a built-up resin (epoxy resin including filler), and a liquid crystal polymer may be used as the material of the insulative layer 54. Further, an adhesive sheet of anisotropic conductive resin (ACF) or a paste of anisotropic conductive resin (ACP) may be used as the material of the insulative layer 54. The insulative layer 54 may have a thickness of, for example, approximately 5 to 15 µm.

[Operation]

In the lower chip 3, the top surfaces 32B of the through electrodes 32 are formed to be substantially flush with the first surface 31A of the insulative layer 31, which covers the first surface 30B of the semiconductor substrate 30. Thus, the upper surface of the lower chip 3 (i.e., lower side of the gap formed between the stacked lower chip 3 and upper chip 4) is flat. In the first embodiment, the insulative layer 54 of the upper chip 4 is one example of an underfill. Further, the upper surface of the insulative layer 31 of the lower chip 3, which contacts the insulative layer 54, is flat. Thus, when the insulative layer 54 is adhered to the insulative layer 31, voids are not formed at the interface between the insulative layer 54 and insulative layer 31. Accordingly, the insulative layer 54 and insulative layer 31 are adhered to each other in a preferred manner.

When the insulative layer 54 is not arranged on the upper chip 4, underfill is charged between the lower chip 3 and the upper chip 4 after mounting the upper chip 4 on the lower chip 3. In this case, the upper surface of the insulative layer 31 of the lower chip 3 is flat. This increases the fluidity of the underfill charged between the lower chip 3 and the upper chip 4 and thus improves the charging characteristics of the underfill.

[Method for Manufacturing Semiconductor Package]

A method for manufacturing the semiconductor package 1 will now be described.

[Method for Manufacturing Lower Chip]

A method for manufacturing the lower chip 3 will now be described with reference to FIGS. 3 to 8. In the description hereafter, a single lower chip is shown in an enlarged state in the drawings for the sake of brevity. However, manufacturing is actually performed at a wafer level. That is, a large number of lower chips are fabricated in a batch on a single wafer. Then, the lower chips are separated from each other into segments. Here, the method for manufacturing a semiconductor integrated circuit will not be described.

In the step shown in FIG. 3A, a substrate 60, which is a base material for the semiconductor substrate 30 described above, is prepared. The substrate 60 has a thickness (e.g., 725 to 775 µm) greater than that of the semiconductor substrate 30. For example, a silicon substrate may be used as the substrate 60.

Next, in the step shown in FIG. 3B, a resist layer 61, which includes openings 61X, is formed on a surface 60A of the substrate 60. The opening 61X exposes the surface 60A of the substrate 60 at portions corresponding to formation regions of the through holes 30X (refer to FIG. 1).

Then, anisotropic etching, such as deep reactive ion etching (DRIE), is performed using the resist layer 61 as a mask to form grooves 60X. The grooves 60X are formed from the surface 60A until reaching a certain depth, or thickness, of the substrate 60. In the step shown in FIG. 7A, which will be described later, the thickness of the substrate 60 is decreased so that the grooves 60X become the through holes 50X. Accordingly, the grooves 60X are formed to be deeper than the through holes 30X. The grooves 60X formed in the step of FIG. 3B may have different depths. After the grooves 60X are formed, a process such as ashing is performed to remove the resist layer 61 shown in FIG. 3B.

Subsequently, in the step shown in FIG. 3C, the insulative film 33 is formed so as to cover the surface 60A of the substrate 60 and the inner wall surfaces defining the grooves 60X. When the substrate 60 is a silicon substrate, the insulative film 33 may be formed by thermally oxidizing the substrate 60. The insulative film 33 may also be formed by performing, for example, chemical vapor deposition (CVD).

Then, in the step shown in FIG. 3D, the seed layer 35 is formed to cover the insulative film 33. For example, sputtering or electroless plating is performed to form the seed layer 35. For example, tantalum nitride (TaN) is sputtered and deposited on the insulative film 33 to form the metal film 36 that covers the insulative film 33. Then, copper is sputtered and deposited on the metal film 36 to form the metal film 37. This forms the seed layer 35, which has a double-layer structure (TaN/Cu). The metal film 36 may have a thickness of, for example, approximately 0.1 µm. The metal film 37 may have a thickness of, for example, approximately 0.2 µm.

Next, in the step shown in FIG. 4A, electrolytic copper plating is performed using the seed layer 35 as a power supplying layer to form the conductive layer 32A on the seed layer 35. The conductive layer 32A fills the grooves 60X, which are covered by the insulative film 33 and the seed layer 35. The conductive layer 32A may be formed by embedding, for example, a conductive paste, molten metal, or metal wire in the groove 60X.

In the step shown in FIG. 4B, for example, a chemical mechanical polishing (CMP) apparatus polishes and removes the unnecessary conductive layer 32A and the seed layer 35. The polishing is performed, for example, until the insulative film 33 is exposed from the surface 60A of the substrate 60.

In the step shown in FIG. 4C, the wiring pattern 40, the insulative layer 42, the vias 41, and the wiring layer 43 are stacked on the upper surface of the structure shown in FIG. 4D.

In the step shown in FIG. 4D, the protective film 44 is formed on the insulative layer 42 and the wiring layer 43. The protective film 44 includes the openings 44X that expose parts of the electrode pads 43P, which are formed by parts of the wiring layer 43. The openings 44X of the protective film 44 are formed through the next procedures. First, for example, CVD is performed to form the protective film 44 that covers the insulative layer 42 and the wiring layer 43. Next, a resist layer exposing the protective film 44 is formed at portions corresponding to the openings 44X. Then, a process such as dry etching is performed to remove exposed portions of the protective film 44 using the resist layer as a mask. This forms the openings 44X.

In the step shown in FIG. 5A, a seed layer 64 is formed covering the upper surface of the protective film 44, the inner wall surfaces of the protective film 44 defining the openings 44X, and the upper surfaces of the electrode pads 43P exposed from the openings 44X. The seed layer 64 is formed through the next procedures. First, titanium (Ti) is sputtered and deposited on the upper surface of the protective film 44, the inner wall surfaces of the protective film 44 defining the openings 44X, and the upper surfaces of the electrode pads 43P to form a Ti film 65. Then, copper is sputtered and deposited on the Ti film 65 to form a Cu film 66. This forms the seed layer 64, which has a double-layer structure (Ti/Cu). The Ti film 65 may have a thickness of, for example, approximately 0.1 μm. The Cu film 66 may have a thickness of, for example, approximately 0.2 μm. In the seed layer 64, the Ti film 65 functions as an adhesion layer that increases the adhesion between the protective film 44 and the Cu film 66. In addition to Ti, for example, chromium (Cr) may be used as the material of a metal layer functioning as an adhesion layer.

In the step shown in FIG. 5B, a resist layer 67, which includes openings 67X, is formed on the seed layer 64. The openings 67X expose the upper surface of the seed layer 64 at portions corresponding to the formation regions of the connection terminals 45 and the metal layer 46 (refer to FIG. 2) on the electrode pads 43P. A photosensitive dry film or a liquid photoresist (liquid resist such a novolak resin or epoxy resin) may be used as the material of the resist layer 67. When using, for example, a dry film, the dry film is thermally compressed and laminated onto the seed layer 64. Then, the dry film is patterned by undergoing exposure and development. This forms the resist layer 67 including the openings 67X with a predetermined pattern corresponding to the formation regions of the connection terminals 45. When using a liquid photoresist, the resist layer 67 may be formed through the same procedures.

In the step shown in FIG. 5C, electrolytic plating is performed using the resist layer 67 as a mask and the seed layer 64 as a power supplying layer. More specifically, electrolytic plating is performed on the upper surface of the seed layer 64 exposed from the openings 67X of the resist layer 67 to sequentially form a Cu layer 68, which becomes the connection terminals 45, and a metal layer 69, which becomes the metal layer 46. The step of FIG. 5C is performed through the next procedures. First, electrolytic plating is performed using the seed layer 64 as a plating power supplying layer to form the Cu layer 68, which becomes the pillar-shaped connection terminals 45, on the seed layer 64. Then, for example, when the metal layer 69 is lead-free solder (e.g., Sn—Ag), electrolytic solder plating is performed using the seed layer 64 as a plating power supplying layer to apply the metal layer 69, or Sn—Ag solder layer, on the CU layer 68.

In the step shown in FIG. 5D, a process such as aching is performed to remove the resist layer 67 shown in FIG. 5C.

Then, etching is performed using the Cu layer 68 and the solder layer 69 as a mask to remove the unnecessary seed layer (Ti film 65 and Cu film 66). The remaining seed layer (Ti film 65 and Cu film 66) and Cu layer 68 form the connection terminals 45.

Figure 6A:
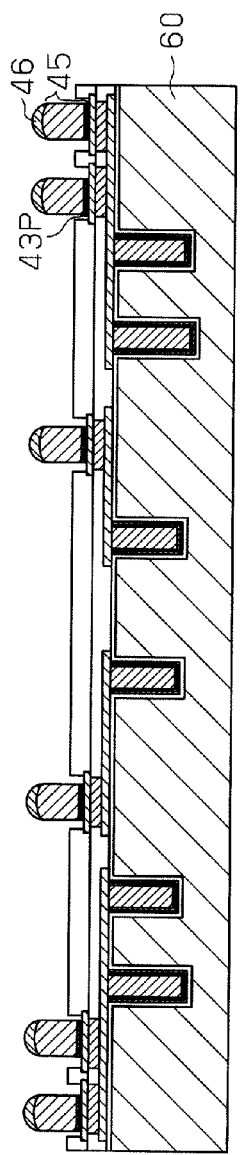
FIGS. 6A to 6C are schematic cross-sectional views showing procedures for manufacturing the semiconductor chip in the first embodiment.

Next, in the step shown in FIG. 6A, flux is applied to the solder layer 69 shown in FIG. 5D. Then, a reflow process is performed under a temperature of, for example, 240° C. to 260° C. to melt the solder layer 69 and electrically connect the connection terminals 45 and the metal layer 46. Afterwards, the flux remaining around the metal layer 46 is washed and removed.

Figure 6B:
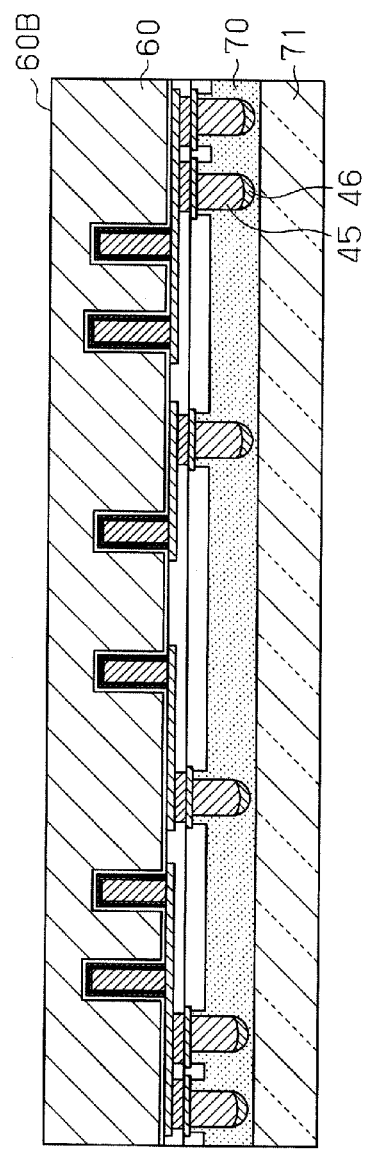

In the step shown in FIG. 6B, a support 71 is adhered by an adhesive agent 70 to the upper side of the structure shown in FIG. 6A, that is, the side on which the connection terminals 45 and the metal layer 46 are formed. For example, silicon or glass may be used as the material of the support 71.

Figure 6C:
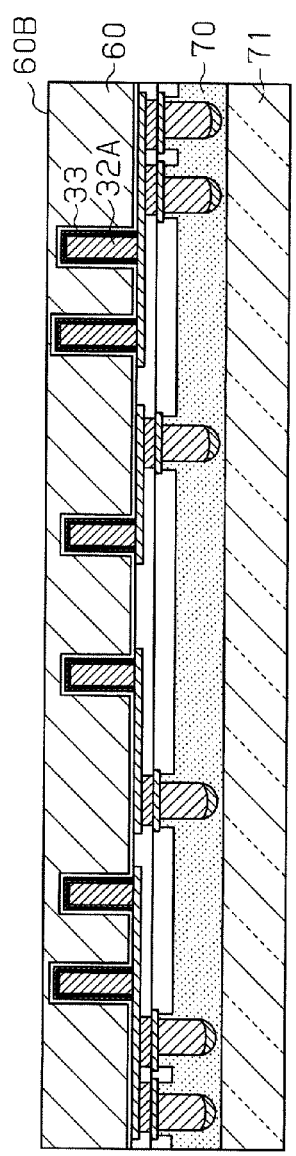

In the step shown in FIG. 6C, for example, a back surface polishing apparatus is used to polish the surface 60B of the substrate 60 and decrease the thickness of the substrate 60. Here, the surface 60B is polished so as not to expose the conductive layer 32A and the insulative film 33.

Next, in the step shown in FIG. 7A, the thickness of the substrate 60 is further decreased to expose the insulative film 33. More specifically, parts of the substrate 60 (silicon substrate) are selectively removed from the insulative film 33. The decrease in the thickness of the substrate 60 forms the through holes 30X in the substrate 60. Further, the decrease in the thickness of the substrate 60 obtains a substrate 30C, which corresponds to the semiconductor substrate 30 (refer to FIG. 1). A process such as wet etching, which uses, for example, a solution of nitric acid ($HNO_3$) or hydrogen fluoride (HF), and plasma etching (dry etching) may be performed to decrease the thickness of the substrate 60. Here, the insulative film 33 is not etched. Thus, parts of the conductive layer 32A covered by the insulative film 33 are exposed from the substrate 30C.

In the step shown in FIG. 7B, the insulative layer 31 is formed to cover the insulative film 33 and the conductive layer 32A, which are exposed from the substrate 30C, on the first surface 30B of the substrate 30C. The insulative layer 31 is formed, for example, through the next procedures. First, a resin film of an epoxy resin or the like is vacuum-laminated to cover the first surface 30B of the substrate 30C, the insulative film 33, and the conductive layer 32A. The resin film is then pressed. Afterwards, the resin film is cured by performing a heat treatment under a temperature of 150+ C. to 190° C. to form the insulative layer 31. The insulative layer 31 may also be formed by applying a resin liquid such as an epoxy resin to cover the first surface 30B of the substrate 30C, the insulative film 33, and the conductive layer 32A.

In the step shown in FIG. 7C, the insulative layer 31, the insulative film 33, the conductive layer 32A, and the seed layer 35 are flattened so that the upper surface of the conductive layer 32A and the upper surface of the seed layer 35 become flush with the upper surface of the insulative layer 31. This exposes the upper surface of the conductive layer 32A and the upper surface of the seed layer 35 from the substrate 30C and forms the openings 31X in the insulative layer 31. The step of FIG. 7C forms the through electrodes 32 that are filled in the through holes 30X, which are covered by the insulative film 33, and the openings 31X. Here, the inner wall surfaces of the insulative layer 31 defining the openings 31X are entirely covered by the insulative film 33. Further, the through electrodes 32 are formed by the conductive layer 32A and the seed layer 35 (metal film 36 formed from TaN and metal film 37 formed from Cu). The seed layer 35 is formed between the insulative film 33 and the conductive layer 32A. To perform the flattening described above, for example, grinding or polishing may be performed. In the first embodiment, the flattening is performed by bite grinding using a blade of tungsten carbide or diamond.

Next, in the step shown in FIG. 8A, the connection terminals 34 are formed on the top surface 32B of the through electrodes 32. When, for example, the connection terminals 34 are formed by an Ni/Au layer, electroless plating is formed to sequentially stack an Ni layer and an Au layer on the top surfaces 32B of the through electrodes 32. This forms a structural body corresponding to the lower chip 3 above the support 71.

In the step shown in FIG. 8B, a dicing tape 73, which is supported by a dicing frame (not shown) is adhered to the surface of the structure corresponding to the lower chip 3 at the side on which the connection terminals 34 are formed. In the step shown in FIG. 8C, the adhesive agent 70 and support 71 shown in FIG. 8B are removed. Then, the wafer (substrate 30C) is cut along lines defining each chip region and separated into segments to obtain lower chips 3. As a result, the substrate 30C becomes the semiconductor substrate 30. Subsequent to the dicing, each lower chip 3 held on the dicing tape 73 is picked up and used in the next step.

Next, in the step of FIG. 9A, the wiring substrate 2 is prepared. The wiring substrate 2 may be formed through a known manufacturing method, which will now be briefly described.

When manufacturing the wiring substrate 2, the core substrate 11 is first prepared. The core substrate 11 is, for example, a copper clad laminate (CCL). Through holes are formed in the CCL, and the wall surfaces of the through holes are plated to conductively connect the two opposite surfaces of the core substrate 11. Then, for example, a subtractive process is performed to form the wires 14 and 15. A resin film is vacuum-laminated to each of the two surfaces of the core substrate 11. The resin films are heated and cured to form the insulative layers 12 and 13. Then, openings are formed in the insulative layers 12 and 13. When necessary, a desmear process is performed. Afterwards, a semi-additive process is formed to form the vias 16 and 17 and the wiring patterns 20 and 23. Then, the solder resist layers 22 and 25, which include the openings 22X and 25X that expose parts of the wiring patterns 20 and 23 as the pads 20P and 23P, are formed.

Next, the connection terminals 21 are formed on the electrode pads 20P. For example, when the connection terminals 21 are a presolder, a solder paste formed from an alloy of Sn and Ag is applied to the electrode pads 20P and undergoes a reflow process to form the connection terminals 21. When, for example, the connection terminals 21 are formed by an Sn layer (surface protection layer), electroless plating is performed to form an Sn layer on the electrode pads 20P. This forms the wiring substrate 2.

Then, an insulative layer 26A in a B-stage state (semi-cured state) is formed at the upper side of the wiring substrate 2 to cover the connection terminals 21. For example, an epoxy resin may be used as the material of the insulative layer 26A. The insulative layer 26A has a thickness set to entirely cover the connection terminals 45 when mounting the lower chip 3 onto the wiring substrate 2. When a film of an insulative resin is used to form the insulative layer 26A, the film of insulative layer is laminated with the upper surface of the wiring substrate 2. In this step, thermal curing of the film of insulative layer is not performed, and the insulative layer 26A is left in the B-stage state. Here, the film of insulative resin is laminated in a vacuum atmosphere to suppress the formation of voids in the insulative layer 26A. When a liquid or paste of insulative resin is used to form the insulative layer 26A, for example, printing or spin coating is performed to apply the liquid or paste of insulative resin to the upper surface of the wiring substrate 2. Then, the applied insulative resin is prebaked to form the insulative layer 26A in the B-stage state.

Next, in the step shown in FIG. 9A, the picked up lower chip 3 is arranged above the wiring substrate 2 on which the insulative layer 26A is formed. Then, the connection terminals 21, which are formed on the electrode pads 20P of the wiring substrate 2, are opposed to and positioned relative to the connection terminals 45 (metal layer 46), which are formed on the electrode pads 43P of the lower chip 3.

In the step shown in FIG. 9B, the connection terminals 45 of the lower chip 3 are flip-chip bonded to the connection terminals 21 formed on the electrode pads 20P. For example, the adhesiveness of the insulative layer 26A, which is in the B-stage state and not thermally cured, is used to temporarily fix the lower chip 3 to the wiring substrate 2 with the insulative layer 26A. When necessary, the lower chip 3 may be forced toward the insulative layer 26A (wiring substrate 2). In this state, the connection terminals 45 of the lower chip 3 (and the metal layer 46, which is formed on the connection terminals 45) are arranged at positions corresponding to the connection terminals 21 on the electrode pads 20P of the wiring substrate 2. Further, a heating process is performed under a temperature of, for example, 240° C. to 260° C., and load is applied from the lower chip 3 toward the wiring substrate 2. This electrically connects the electrode pads 20P and the connection terminals 45. When solder is used for at least either one of the connection terminals 21 and the connection terminals 45, the solder is melted and cured to connect the connection terminals 21 and 45. Further, the insulative layer is thermally cured by the heating process. This covers the electrode pads 20P and 43P and the connection terminals 45 with the thermally cured insulative layer 26.

Next, the upper chip 4, which is stacked on the lower chip 3, is prepared. A method for manufacturing the upper chip 4 will now be described with reference to FIG. 10. In the description hereafter, a single upper chip is shown in an enlarged state in the drawings for the sake of brevity. However, manufacturing is actually performed at a wafer level. Thus, a large number of upper chips 4 are fabricated in a batch on a single wafer. Then, the upper chips 4 are separated from each other into segments. Here, the step for separating the upper chips 4 will not be described.

Figure 10A:
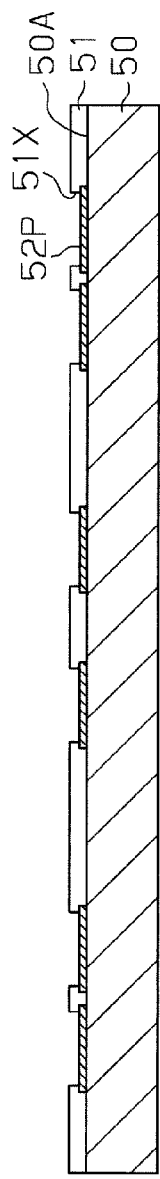
FIGS. 10A to 10C are schematic cross-sectional views showing procedures for manufacturing a semiconductor chip in the first embodiment.

In the step shown in FIG. 10A, the semiconductor substrate 50, which includes a semiconductor integrated circuit (not shown) formed through a known process, is prepared. For example, the semiconductor integrated circuit is formed by a certain device process on the first surface 50A (upper surface in FIG. 10A) of the semiconductor substrate 50. Then, the protective film 51 is formed on the first surface 50A of the semiconductor substrate 50. Next, parts of the protective film 51 are removed to form the openings 51X, which expose parts of a wiring layer formed with a certain pattern on each device. The parts of the wiring layer exposed from the openings 51X define the electrode pads 52P. Laser processing using, for example, a YAG laser or an excimer laser is performed to form the openings 51X.

Figure 10B:
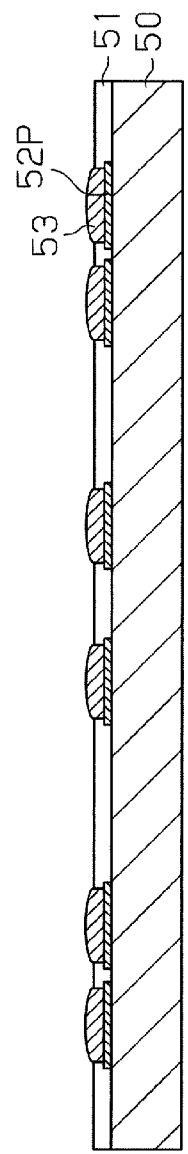

In the step shown in FIG. 10B, the connection terminals 53 are formed on the electrode pads 52P. In this step, zincate processing is first performed on aluminum surfaces of the electrode pads 52P so that electroless plating can be performed on the electrode pads 52P. When the connection terminals 53 are formed by, for example, an Ni/Au/Sn layer, electroless plating is performed to sequentially form an Ni layer, Au layer, and Sn layer on the electrode pads 52P.

Figure 10C:
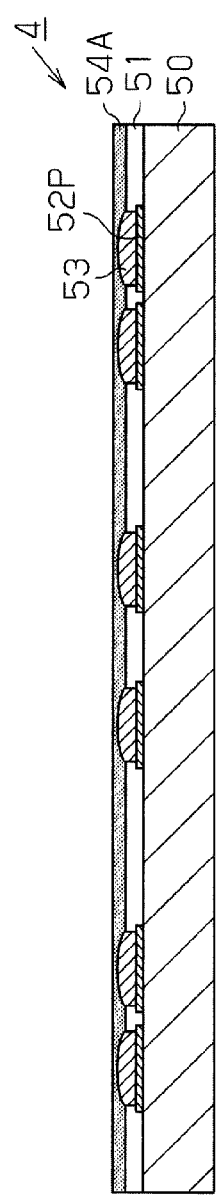

In the step shown in FIG. 10C, an insulative layer 54A in a B-stage state (semi-cured state) is formed on the protective film 51. For example, an epoxy resin may be used as the material of the insulative layer 54A. When a film of an insulative resin is used to form the insulative layer 54A, the film of insulative layer is laminated with the upper surface of the protective film 51. In this step, thermal curing of the film of insulative layer is not performed, and the insulative layer 54A is left in the B-stage state. Here, the film of insulative resin is laminated in a vacuum atmosphere to suppress the formation of voids in the insulative layer 54A. When a liquid or paste of insulative resin is used to form the insulative layer 54A, for example, printing or spin coating is performed to apply the liquid or paste of insulative resin to the upper surface of the protective film 51. Then, the applied insulative resin is prebaked to form the insulative layer 54A in the B-stage state. This manufactures the upper chip 4.

Next, in the step shown in FIG. 11A, the upper chip 4, which is manufactured as described above, is located above the lower chip 3 in which the connection terminals 34 are formed on the top surface 32B of the through electrodes 32.

Next, in the step shown in FIG. 11B, the connection terminals 53 of the upper chip 4 is flip-chip bonded to the connection terminals 34 formed on the through electrodes 32. Here, the lower surface of the insulative layer 54A of the upper chip 4 is adhered to the upper surface of the insulative layer 31 of the lower chip 3. Further, the connection terminals 53 of the upper chip 4 pierce the insulative layer 54A, which is in the semi-cured state, and contact the connection terminals 34 of the lower chip 3. This electrically connects the connection terminals 34 and 53. When solder is used for at least either one of the connection terminals 34 and the connection terminals 53, the solder is melted and cured to connect the connection terminals 34 and 53. Further, when ACF or ACP is used for the insulative layer 54, pressure is applied to the insulative layer 54 (ACF or ACP) between the connection terminals 53 and the connection terminals 34. As a result, strong force is applied to portions of the insulative layer 54 held between the connection terminals 34 and 53, and these portions become conductive in the thicknesswise direction. This electrically connects the connection terminals 34 and 53. When the connection terminals 34 and 53 are electrically connected in this manner, the electrode pads 52P of the upper chip 4 are electrically connected to the through electrodes 32 through the connection terminals 53 and 34. Consequently, the electrode pads 52P of the upper chip 4 are electrically connected to the electrode pads 20P of the wiring substrate 2 by the through electrodes 32 and the like. To stack the lower chip 3 on the upper chip 4, for example, a reflow process or a process that heats and presses together the lower chip 3 and the upper chip 4 with a bonding tool may be performed. Further, the insulative layer 54A, which is in a B-stage state, undergoes a heating process during the stacking or after the stacking. This heats the insulative layer 54A for a predetermined time to a curing temperature or higher and cures the insulative layer 54A. The thermal curing forms the insulative layer 54, and the lower surface of the insulative layer 54 is adhered to the upper surface of the insulative layer 31. Further, the insulative layer 54 covers the through electrodes 32, the connection terminals 34 and 53, and the electrode pads 52P. Here, the material of the insulative layer 54 is the same as the material of the underlying insulative layer 31. This suppresses delamination at the interface between the insulative layer 54 and the insulative layer 31 that would occur if there were a difference in physical property (thermal expansion or the like) between the material of the insulative layer 54 and the material of the insulative layer 31.

Figure 12:
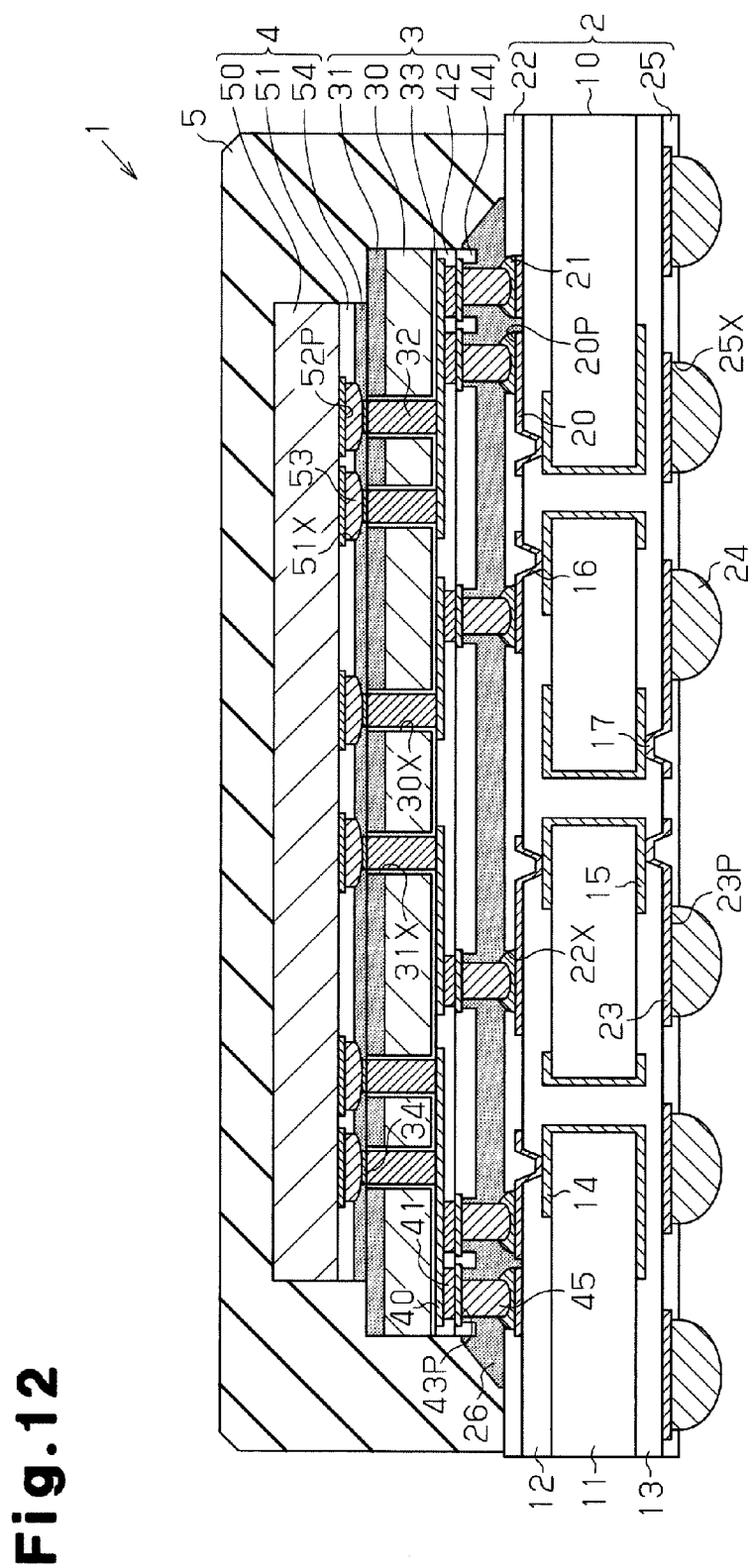
FIG. 12 is a schematic cross-sectional view showing a procedure for manufacturing the semiconductor package of the first embodiment.

Next, in the step shown in FIG. 12, the encapsulation resin 5 is formed to seal the semiconductor chips 3 and 4 stacked on the wiring substrate 2. When a thermosetting molding resin is used as the encapsulation resin 5, the structure shown in FIG. 11B is arranged in a mold, molding resin is charged into the mold, and pressure (e.g., 5 to 19 MPa) is applied to the molding resin. Then, the molding resin is heated at a heating temperature of, for example, 180° C. to form the encapsulation resin 5.

Then, in the step shown in FIG. 12, the external connection terminals 24 are formed on the external connection pads 23P of the wiring substrate 2. Bumps, for example, can be used as the external connection terminals 24. The semiconductor package 1 of the first embodiment is manufactured in this manner through the steps described above.

In the first embodiment, the manufacturing steps shown in FIGS. 3 to 8 configure one example of a first step, the manufacturing steps shown in FIG. 9 configure one example of a second step, the manufacturing steps shown in FIG. 10 configure one example of a third step, and the manufacturing steps shown in FIG. 11 configure one example of a fourth step.

The first embodiment has the advantages described below.

(1) The lower chip 3 is formed so that the top surfaces of the through electrodes 32 are substantially flush with the first surface 31A of the insulative layer 31, which covers the first surface 30B of the semiconductor substrate 30. Thus, the upper surface of the lower chip 3 (i.e., the lower side of the gap between the stacked lower chip 3 and upper chip 4) is flat. When filling an underfill between the lower chip 3 and the upper chip 4, the underfill advances along an even surface. This increases the fluidity of the underfill and improves the charging characteristics of the underfill. Accordingly, the formation of voids in the underfill is suppressed in a preferred manner, and the electric connection reliability between the lower chip 3 and the upper chip 4 is improved.

(2) The insulative film 33 is formed to entirely cover the inner walls surfaces defining the through holes 30X and the inner wall surfaces defining the openings 31X. Further, the metal film 36 is formed to cover the insulative film 33. The metal film 36 functions as a metal barrier layer that suppresses the dispersion of copper from the conductive layer 32A to the insulative film 33 and the insulative layer 31. This improves the insulation reliability of the lower chip 3 (semiconductor chip) in the planar direction.

(3) The connection terminals 34 are formed on the top surface 32B of the through electrodes 32 as pads when flip-chip bonding the upper chip 4 to the lower chip 3. Without the connection terminals 34, insufficient solder wetting may occur when flip-chip bonding the upper chip 4. The connection terminal 34 suppresses insufficient wetting. Accordingly, a decrease in the connection reliability caused by insufficient solder wetting is effectively suppressed.

(4) When decreasing the thickness of the insulative layer 31, the insulative film 33, and the conductive layer 32A to form the through electrodes 32, the insulative layer 31, the insulative film 33, and the conductive layer 32A undergo bite grinding. The bite grinding evenly eliminates the insulative layer 31, the insulative film 33, and the conductive layer 32A regardless of material. Thus, the top surfaces 32B of the through electrodes 32 become flush with the first surface 31A of the insulative layer 31. This obtains a flat and smooth surface. Further, the bite grinding is performed until the upper surface of the conductive layer 32A, which is formed in the shallowest grooves 60X, is exposed. This eliminates depth variations between the grooves 60X. Further, bite grinding does not use a chemical, such as slurry used for CMP. This reduces liquid waste costs, which, in turn, reduces manufacturing costs.

(5) The insulative layer 54A is formed in a semi-cured state on the lower surface of the upper chip 4 opposing the lower chip 3. After stacking the upper chip 4 on the lower chip 3, the insulative layer 54A is thermally cured to form the insulative layer 54. The insulative layer 54 functions in the same manner as an underfill. In this structure, when stacking the upper chip 4 on the lower chip 3, the insulative layer 54A, which is in a semi-cured state, is deformed to cover the connection terminals 34 and 53 and the electrode pads 52P. This suppresses the formation of voids in the underfill (insulative layer 54) in a preferred manner. Further, a step for charging the underfill may also be eliminated.

(6) The resin material of the insulative layer 54 has the same composition as the resin material of the underlying insulative layer 31. This effectively suppresses delamination at the interface between the insulative layer 54 and the insulative layer 31 that would occur if there were a difference in physical property (thermal expansion or the like) between the material of the insulative layer 54 and the material of the insulative layer 31.

(7) Electroless plating is performed to form the connection terminals 34 of the lower chip 3. Further, the connection terminals 53 of the upper chip 4 are formed by performing electroless plating or electrolytic plating. A wet process such as electroless plating or electrolytic plating easily forms a thin film of a fine terminal. This allows for easy application to a large number of pins and narrow pitch pads.

Second Embodiment

A second embodiment will now be described with reference to FIGS. 13 to 16. Like or same reference numerals are given to those components that are the same as the corresponding components of the first embodiment. Such components will not be described in detail.

In the first embodiment, the semiconductor package 1 is formed by stacking the two semiconductor chips 3 and 4 on the wiring substrate 2. In the second embodiment, a semiconductor package 1A is formed by stacking three or more (for example, four) semiconductor chips on the wiring substrate 2.

Figure 13:
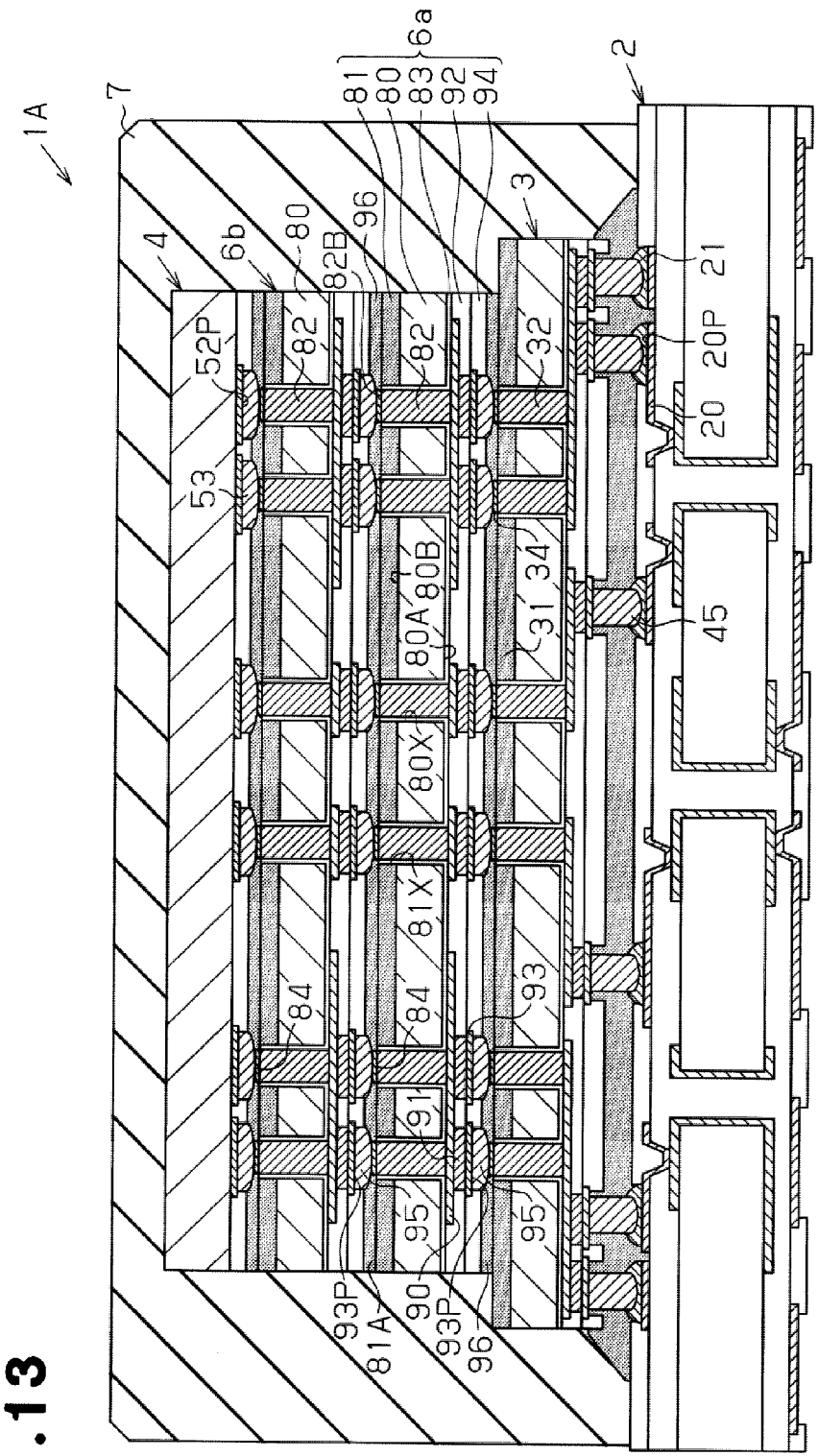
FIG. 13 is a schematic cross-sectional view of a semiconductor package according to a second embodiment.

As shown in FIG. 13, the semiconductor package 1A includes a wiring substrate 2, a semiconductor chip 3 mounted on the wiring substrate 2, semiconductor chips 6a, 6b, and 4 stacked on the semiconductor chip 3, and an encapsulation resin 7 sealing the semiconductor chips 3, 6a, 6b, and 4 stacked on the wiring substrate 2. Each of the semiconductor chips 3, 6a, and 6b is one example of a first semiconductor device, and the semiconductor chip 4 is one example of a second semiconductor device. A semiconductor chip for a logic device, such as a CPU or an MPU, may be used as the semiconductor chip 3. A semiconductor chip for a memory device, such as a DRAM or an SDRAM, may be used as any of the semiconductor chips 6a, 6b, and 4. The semiconductor chip 3 is stacked at the first stage, the semiconductor chip 6a is stacked at the second stage, the semiconductor chip 6b is stacked at the third stage, and the semiconductor chip 4 is stacked at the fourth stage.

The encapsulation resin 7 is arranged on the wiring substrate 2 to seal the stacked semiconductor chips 3, 6a, 6b, and 4. An insulative resin, such as an epoxy resin or a polyimide resin, may be used as the material of the encapsulation resin 7. The insulative resin does not have to be in a liquid form and may be in a tablet form or a powder form. To apply the encapsulation resin 7, transfer molding, compression molding, injection molding, potting, and the like may be performed. A printing process may also be performed to apply a paste of resin and form the encapsulation resin 5.

The structure of the semiconductor chip 6a will now be described.

The semiconductor chip 6a includes a semiconductor substrate 80, an insulative layer 81 (first insulative layer), through electrodes 82, an insulative film 83, a wiring pattern 90, vias 91, an insulative layer 92, electrode pads 93P, a protective film 94, connection terminals 95, and an insulative layer 96. The connection terminals 95 of the semiconductor chip 6a are flip-chip bonded to the connection terminals 34 of the semiconductor chip 3.

The semiconductor substrate 80 includes a first surface 80B (upper surface in FIG. 13) and a second surface 80A (lower surface in FIG. 13), which is located opposite to the first surface 80B. A semiconductor integrated circuit (not shown) is formed on the second surface 80A of the semiconductor substrate 80. The semiconductor integrate circuit includes a diffusion layer formed in the semiconductor substrate 80, an insulative layer stacked on the semiconductor substrate 80, and vias, wires, and the like arranged on the stacked insulative layer. The semiconductor substrate 80 includes inner wall surfaces defining through holes 80X extending through the semiconductor substrate 80 from the first surface 80B to the second surface 80A at certain locations. The semiconductor substrate 80 is formed from, for example, silicon (Si). The semiconductor substrate 80 may have a thickness of, for example, approximately 30 to 200 μm. The semiconductor substrate 80 is, for example, a segment of a thin Si wafer.

The insulative layer 81 includes a first surface 81A (upper surface in FIG. 13) and a second surface, which is located opposite to the first surface 81A and covers the first surface 80B (surface at the side the upper chip 6b is stacked) of the semiconductor substrate 80. The insulative layer 81 includes inner wall surfaces defining openings 81X aligned with the through holes 80X of the semiconductor substrate 80. Each opening 81X, which is in communication with the corresponding through hole 80X, has substantially the same diameter as the through hole 80X. An insulative resin, such as an epoxy resin or a polyimide resin, may be used as the material of the insulative layer 81. For example, an adhesive film of insulative resin (e.g., NCF), a paste of insulative resin (e.g., NCP), a built-up resin (epoxy resin including filler), and a liquid crystal polymer may be used as the material of the insulative layer 81. The insulative layer 81 may have a thickness of, for example, approximately 10 to 50 μm.

The insulative film 83 is formed to cover the second surface 80A of the semiconductor substrate 80, the inner wall surfaces of the semiconductor substrate 80 defining the through holes 80X, and the inner wall surfaces of the insulative layer 81 defining the openings 81X. For example, a silicon oxide film or a silicon nitride film may be used as the insulative film 83. The insulative film 83 has a thickness of, for example, approximately 0.5 to 1.0 μm.

The through electrodes 82 fill the through holes 80X and the openings 81X in the insulative film 83. Each through electrode 82 has a bottom surface that is substantially flush with the lower surface of the insulative film 83, which covers the second surface 80A of the semiconductor substrate 80. The bottom surface of the through electrode 82 is electrically connected to the wiring pattern 90.

Further, each through electrode 82 includes a top surface 82B (first end surface) that is substantially flush with the first surface 81A (surface at the opposite side of the surface contacting the semiconductor substrate 80) of the insulative layer 81, which covers the first surface 80B of the semiconductor substrate 80. The through electrode 82 is pillar-shaped and has a diameter of, for example, 10 to 20 µm. The through electrodes 82 are arranged at a pitch of, for example, 40 to 100 µm.

A connection terminal 84 is formed on the top surface 82B of each through electrode 82. The connection terminal 84 may be formed by a tin (Sn) layer, an Au layer, an Ni/Au layer (metal layer formed by applying an Ni layer and an Au layer in this order to the top surface 82B), a Pd/Au layer (metal layer formed by applying a Pd layer and an Au layer in this order to the top surface 82B), or an Ni/Pd/Au layer (metal layer formed by applying an Ni layer, a Pd layer, and an Au layer in this order to the top surface 82B). When the connection terminal 84 is an Ni/Au layer, the Ni layer may have a thickness of, for example, 0.1 to 3.0 µm, and the Au layer may have a thickness of, for example, approximately 0.001 to 1.0 µm.

The wiring pattern 90 is formed on the lower surface of the insulative film 83 that covers the second surface 80A of the semiconductor substrate 80. The wiring pattern 90 includes a first end portion connected to the bottom surface of a through electrode 82 and a second end portion connected by a via 91 to an electrode pad 93P. Thus, the wiring pattern 90 and the via 91 electrically connect the through electrode 82 and the electrode pad 93P. The wiring pattern 90 and the via 91 may be formed from, for example, copper or copper alloy.

The insulative layer 92 is formed to cover the wiring pattern 90. The insulative layer 92 includes openings exposing parts of the wiring pattern 90. Each opening includes the via 91. The insulative layer 92 may be formed by, for example, a low dielectric material (so-called low-k material) having a low dielectric constant. One example of a low dielectric material is SiOC. Other examples of a low dielectric material are SiOF and organic polymers. The insulative layer 92 may have a dielectric constant of, for example, approximately, 3.0 to 3.5. The insulative layer 92 has a thickness of, for example, 0.5 to 2 µm.

A wiring layer 93 is formed on the lower surfaces of the vias 91. The wiring layer 93 is formed to cover the vias 91. The wiring layer 93 may be formed from, for example, aluminum. For example, an alloy of Cu and Al or an alloy of Cu, Al, and Si may be used as the material of the wiring layer 93.

The protective film 94 is formed on the lower surface of the insulative layer 92 to cover the lower surface of the insulative layer 92 and parts of the wiring layer 93. Further, the protective film 94 includes a plurality of openings, which expose parts of the wiring layer 93 as the electrode pads 93P. The protective film 94 protects a semiconductor integrated circuit (not shown) formed on the second surface 80A of the semiconductor substrate 80 and may also be referred to as a passivation film. For example, a SiN film, a PSG film, or the like may be used as the protective film 94. Further, the protective film 94 may be formed by laminating a layer of a SiN film or a PSG film with a polyimide layer.

The connection terminals 95 are formed on the electrode pads 93P. The connection terminals 95 are electrically connected to the through electrodes 82 and electrically connected to the semiconductor integrated circuit (not shown). In a state in which the semiconductor chip 6a is stacked on the semiconductor chip 3, the connection terminals 95 are electrically connected by the connection terminals 34 of the semiconductor chip 3 to the through electrodes 32. Thus, the wiring pattern 90, the vias 91, the electrode pads 93P, the connection terminals 95, and the connection terminals 34 electrically connect the through electrodes 82 of the semiconductor chip 6a to the through electrodes 32 of the semiconductor chip 3. In this manner, the through electrodes 32 and 82 electrically connect the semiconductor chips 3 and 6a.

The connection terminals 95 may be formed by an Ni/Au/Sn layer (metal layer formed by applying an Ni layer, an Au layer, and an Sn layer in this order to the pads 93P) or an Ni/Pd/Au/Sn layer (metal layer formed by applying an Ni layer, a Pd layer, an Au layer, and an Sn layer in this order to the pads 93P). Further, the connection terminals 95 may be formed by an Ni/Au layer (metal layer formed by applying an Ni layer and an Au layer in this order to the pads 93P) or an Ni/Pd/Au layer (metal layer formed by applying an Ni layer, a Pd layer, and an Au layer in this order to the pads 93P). The connection terminals 95 (metal layers) may be formed by performing, for example, Al zincate processing or electroless plating. In the same manner as the connection terminals 45 and the metal layer 46, the connection terminals 95 may be formed by pillar-shaped connection bumps and a solder layer. In this case, for example, a Cu layer may be used to form the connection bumps, and lead-free solder may be used as the material of the solder layer.

In a state in which the semiconductor chip 6a is stacked on the semiconductor chip 3, the insulative layer 96 is formed on the lower surface of the protective film 94 to cover the connection terminals 95 of the semiconductor chip 6a and the connection terminals 34 and through electrodes 32 of the semiconductor chip 3. The insulative layer 96 increases the connection strength of the connection terminals 34 of the semiconductor chip 3 and the connection terminals 95 of the semiconductor chip 6a. The insulative layer 96 also suppresses corrosion of the through electrodes 32 and the occurrence of electromigration. Accordingly, the insulative layer 96 functions to prevent the reliability of the through electrodes 32 from decreasing. An insulative resin that is used has the same composition as the insulative layer 31 contacting the insulative layer 96 in a state in which the semiconductor chip 6a is stacked on the semiconductor chip 3, that is, the insulative layer 31 formed at the uppermost layer of the lower chip 3. In other words, an insulative resin, such as an epoxy resin or a polyimide resin, may be used as the material of the insulative layer 96. For example, an adhesive film of insulative resin (e.g., NCF), a paste of insulative resin (e.g., NCP), a built-up resin (epoxy resin including filler), and a liquid crystal polymer may be used as the material of the insulative layer 96. Further, an adhesive sheet of anisotropic conductive resin (ACF) or a paste of anisotropic conductive resin (ACP) may be used as the material of the insulative layer 96. The insulative layer 96 may have a thickness of, for example, approximately 5 to 15 µm.

The structure of the semiconductor chip 6b will now be described. The semiconductor chip 6b has substantially the same structure as the semiconductor chip 6a. Thus, like or same reference numerals are given to those components of the semiconductor chip 6b that are the same as the corresponding components of the semiconductor chip 6a. Such components will not be described in detail.

In the same manner as the semiconductor chip 6a, the semiconductor chip 6b includes the through electrodes 82, the connection terminals 84 formed on the upper surfaces of the through electrodes 82, the electrode pads 93P formed on the lower side of the through electrodes 82 and electrically connected to the through electrodes 82, the connection terminals 95 formed on the electrode pads 93P, and the insulative layer 96 formed to cover the connection terminals 95. The connection terminals 95 of the semiconductor chip 6b are flip-chip bonded to the connection terminals 84 of the semiconductor chip 6a. The through electrodes 82, which are formed in the semiconductor chips 6a and 6b, electrically connect the semiconductor chips 6a and 6b. Further, the connection terminals 53 of the semiconductor chip 4 are flip-chip bonded to the connection terminals 84 of the semiconductor chip 6b. The through electrodes 82, which are formed in the semiconductor chip 6b, electrically connect the semiconductor chips 4 and 6b.

[Method for Manufacturing Semiconductor Package]

A method for manufacturing the semiconductor package 1A will now be described with reference to FIGS. 14 to 16.

Figure 14:
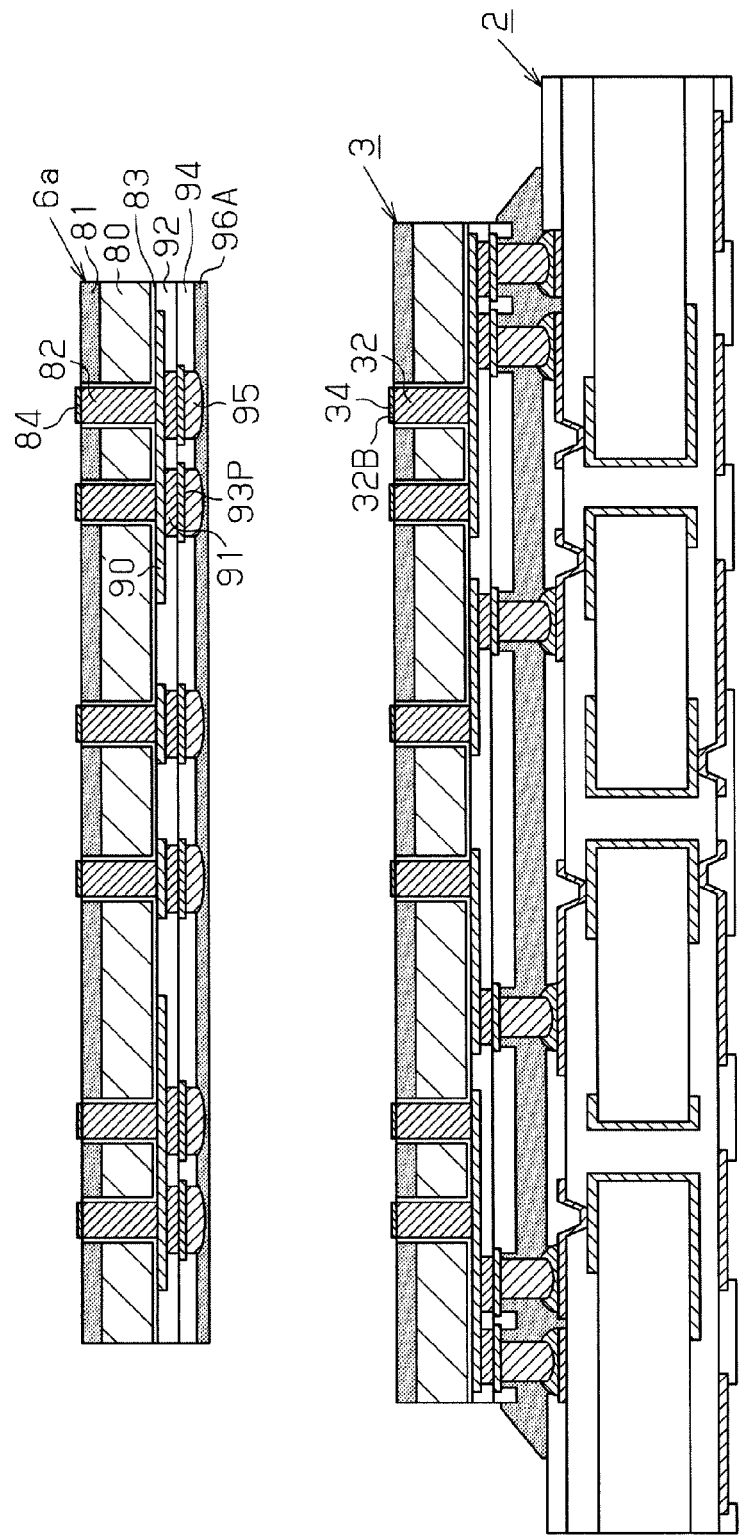
FIG. 14 is a schematic cross-sectional view showing a procedure for manufacturing the semiconductor package of the second embodiment.

The lower section of FIG. 14 shows a structure in which the semiconductor chip 3 is flip-chip bonded to the wiring substrate 2. The structure is manufactured through the manufacturing steps illustrated in FIGS. 3 to 9. The manufacturing steps of the semiconductor chip 6a are substantially the same as the steps illustrated in FIGS. 3 to 10 and thus will not be described in detail here. The same manufacturing steps as those illustrated in FIGS. 3A to 8C may be performed to form the semiconductor substrate 80, the insulative layer 81, the through electrodes 82, the insulative film 83, the connection terminals 84, the wiring pattern 90, the vias 91, the insulative layer 92, the protective film 94, and the connection terminals 95. However, the connection terminals 95 are formed through the step shown in FIG. 10B instead of the steps shown in FIGS. 5A to 6A. An insulative layer 96A in a B-stage state (semi-cured state) is formed on the lower surface of the protective film 94 to cover the connection terminals 95. When a film of an insulative resin is used to form the insulative layer 96A, the film of insulative layer is laminated with the lower surface of the protective film 94. In this step, thermal curing of the film of insulative layer is not performed, and the insulative layer 96A is left in the B-stage state. Here, the film of insulative resin is laminated in a vacuum atmosphere to suppress the formation of voids in the insulative layer 96A. When a liquid or paste of insulative resin is used to form the insulative layer 96A, for example, printing or spin coating is performed to apply the liquid or paste of insulative resin to the upper surface of the protective film 94. Then, the applied insulative resin is prebaked to form the insulative layer 96A in the B-stage state. This manufactures the semiconductor chip 6a.

In the step shown in FIG. 14, the semiconductor chip 6a, which is manufactured as described above, is located above the semiconductor chip 3 in which the connection terminals 34 are formed on the top surface 32B of the through electrodes 32. The connection terminals 34 of the semiconductor chip 3 are opposed to and positioned relative to the connection terminals 95, which are formed on the electrode pads 93P of the semiconductor chip 6a.

Figure 15:
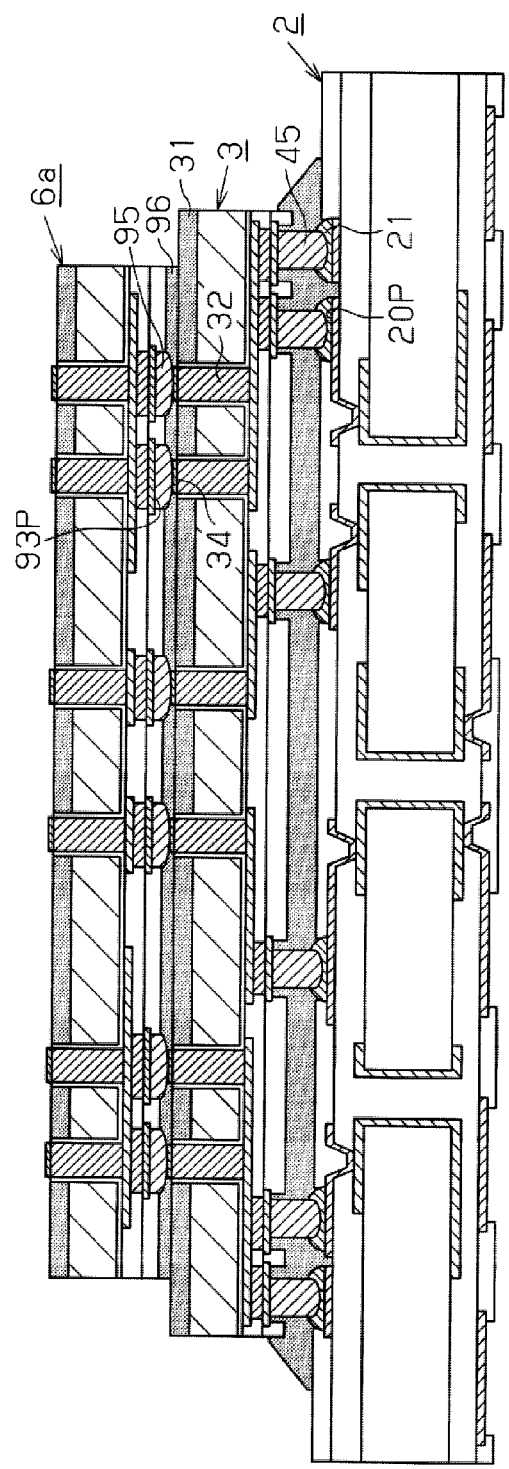
FIG. 15 is a schematic cross-sectional view showing a procedure for manufacturing the semiconductor package of the second embodiment.

Next, in the step shown in FIG. 15, the connection terminals 95 of the semiconductor chip 6a is flip-chip bonded to the connection terminals 34 formed on the through electrodes 32. This electrically connects the electrode pads 93P of the semiconductor chip 6a to the through electrodes 32 through the connection terminals 95 and 34. Consequently, the electrode pads 93P of the semiconductor chip 6a are electrically connected to the electrode pads 20P of the wiring substrate 2 by the through electrodes 32 and the like. To stack the semiconductor chip 6a on the semiconductor chip 3, for example, a reflow process or a process that heats and presses together the semiconductor chip 3 and the semiconductor chip 6a with a bonding tool may be performed. Further, the insulative layer 96A, which is in a B-stage state, undergoes a heating process during the stacking or after the stacking. This heats the insulative layer 96A for a predetermined time to a curing temperature or higher and cures the insulative layer 96A. The thermal curing forms the insulative layer 96 and covers the through electrodes 32, the connection terminals 34 and 95, and the electrode pads 93P with the insulative layer 96. Here, the material of the insulative layer 96 is the same as the material of the underlying insulative layer 31. This suppresses delamination at the interface between the insulative layer 96 and the insulative layer 31 that would occur if there were a difference in physical property (thermal expansion or the like) between the material of the insulative layer 96 and the material of the insulative layer 31.

Figure 16:
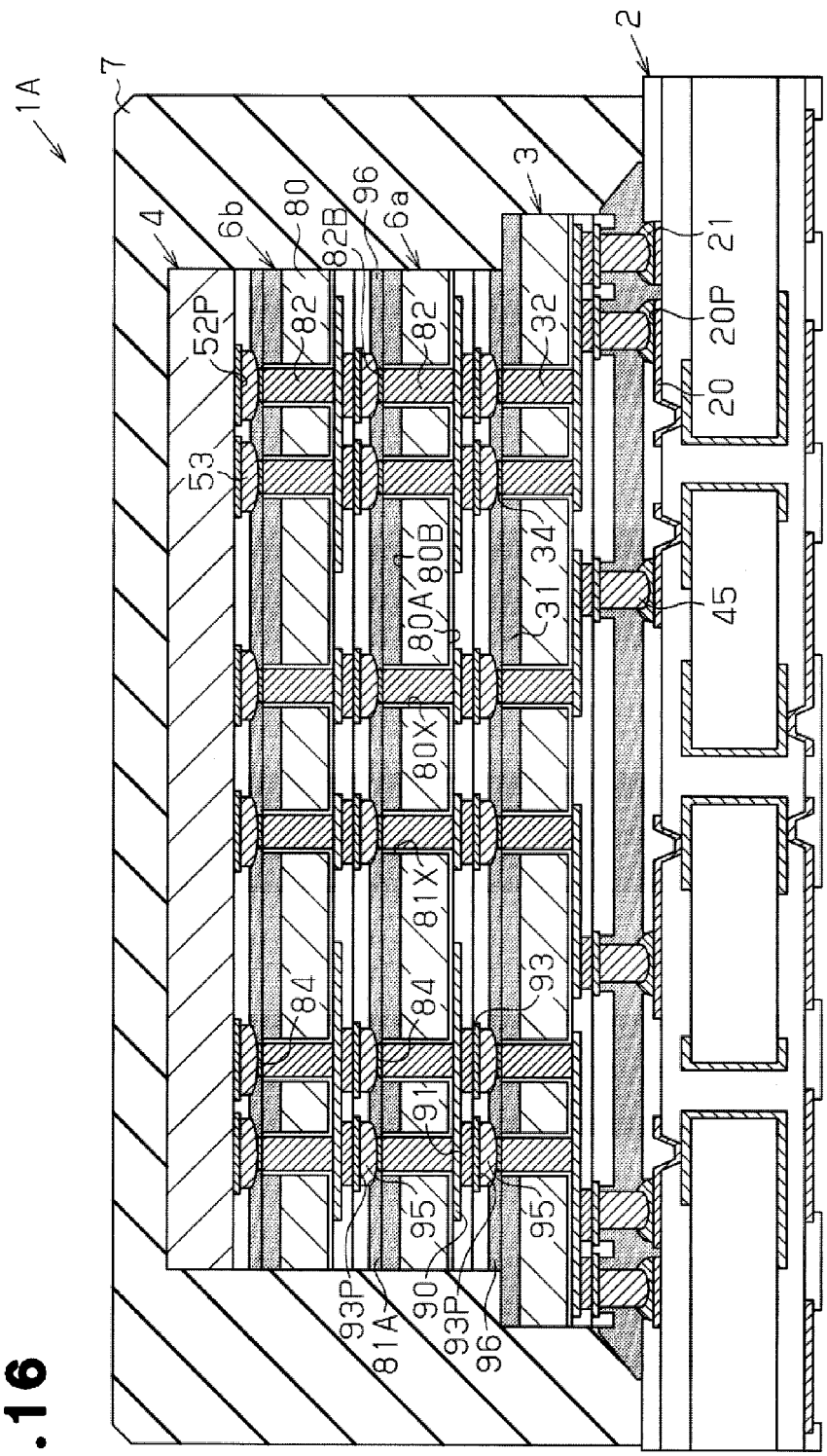
FIG. 16 is a schematic cross-sectional view showing a procedure for manufacturing the semiconductor package of second embodiment.

Then, referring to FIG. 16, the connection terminals 95 of the semiconductor chip 6b are flip-chip bonded to the connection terminals 84 formed on the upper surfaces of the through electrodes 82 of the semiconductor chip 6a. Subsequently, the connection terminals 53 of the semiconductor chip 4 are flip-chip bonded to the connection terminals 84 formed on the upper surfaces of the through electrodes 82 of the semiconductor chip 6b. Further, the encapsulation resin 7 is formed to seal the plurality of semiconductor chips 3, 6a, 6b, and 4 stacked on the wiring substrate 2. The semiconductor package 1A of the second embodiment is manufactured in this manner through the steps described above.

The second embodiment has the same advantages as the first embodiment.

Third Embodiment

A third embodiment will now be described with reference to FIGS. 17 and 18. In the third embodiment, the lower chip and the upper chip are connected differently from the first embodiment. Differences from the first embodiment will mainly be described below. Like or same reference numerals are given to those components that are the same as the corresponding components illustrated in FIGS. 1 to 16. Such components will not be described in detail.

Figure 17:
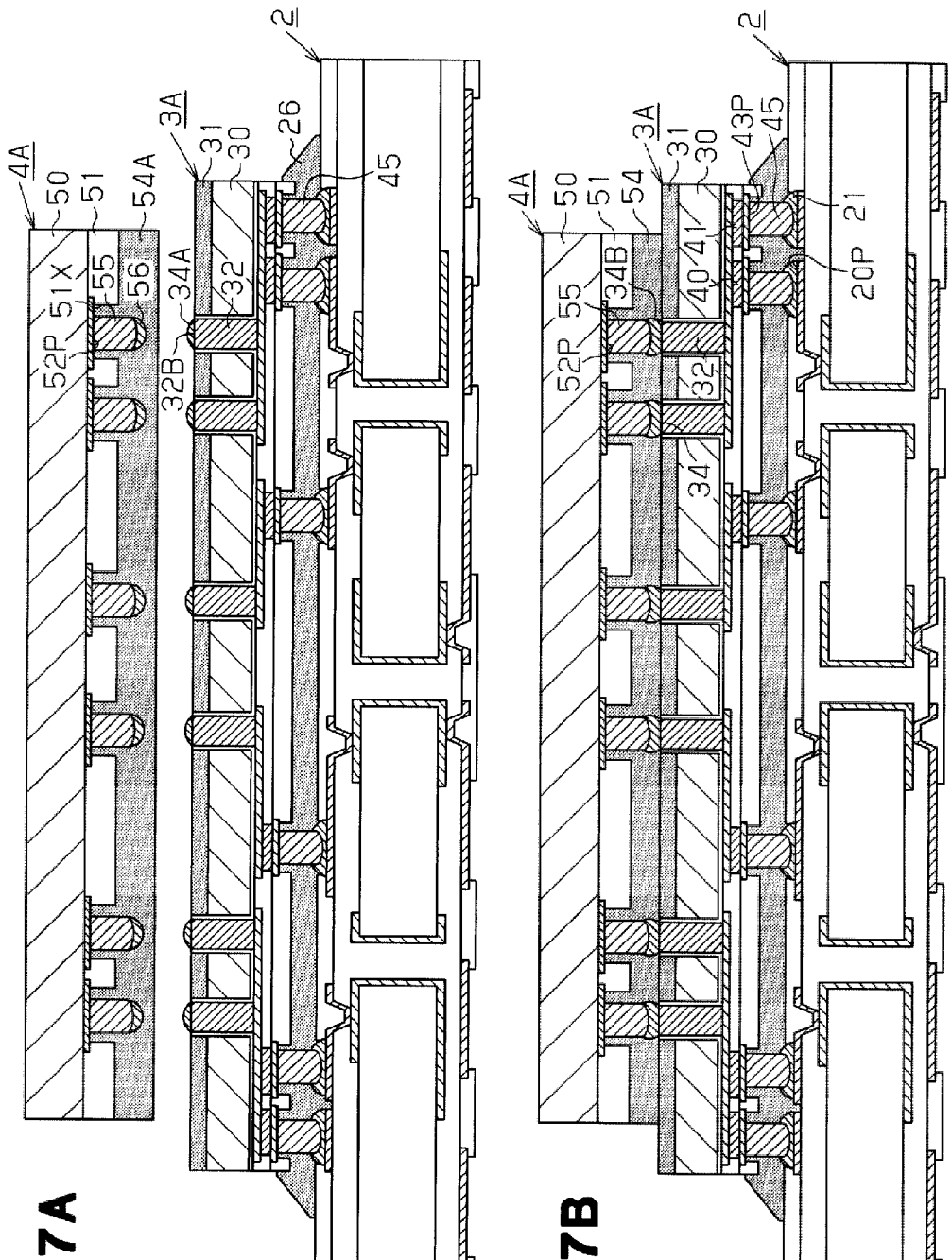
FIGS. 17A and 17B are schematic cross-sectional views showing procedures for manufacturing a semiconductor package according to a third embodiment.
Figure 18:
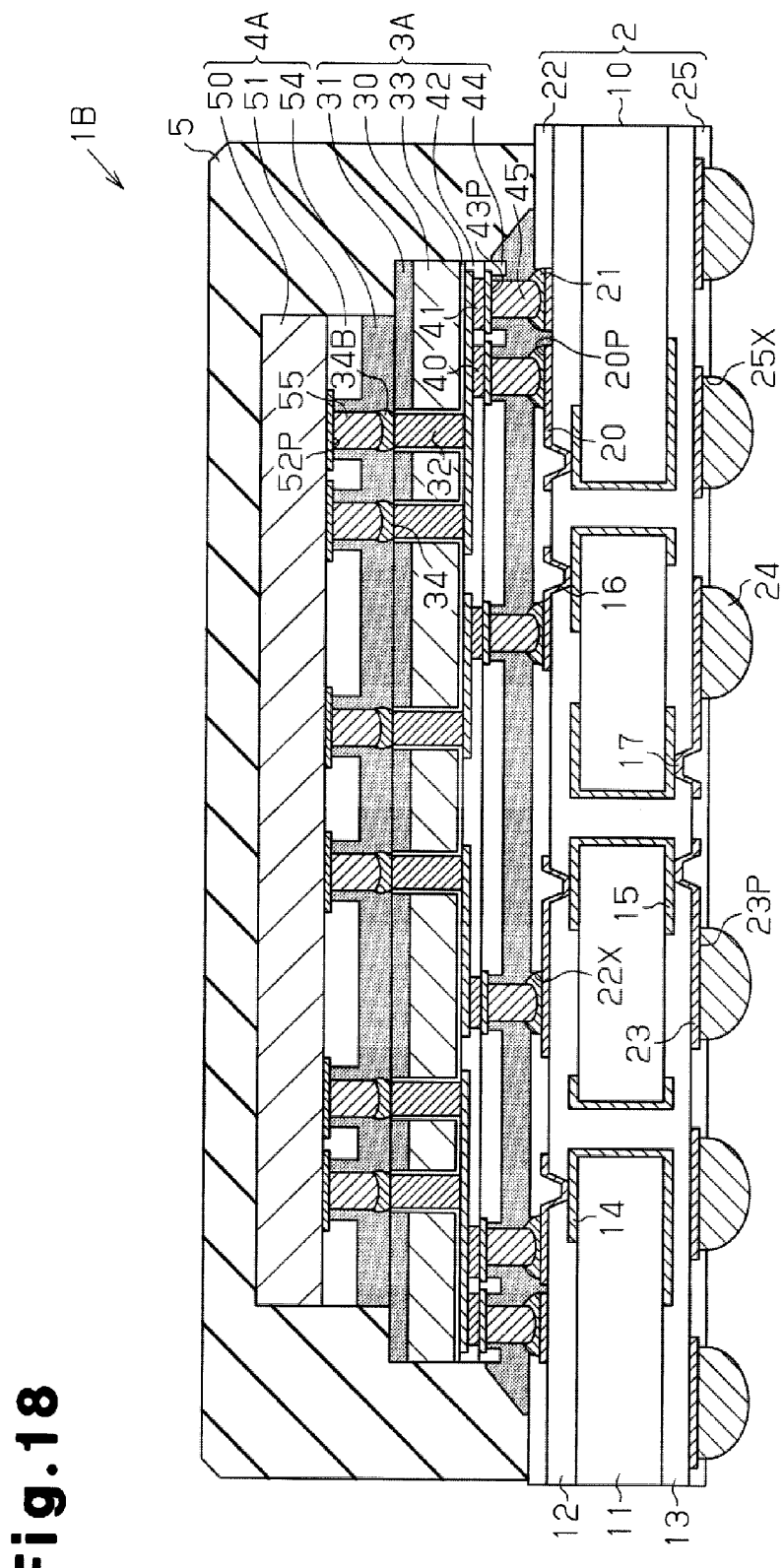
FIG. 18 is a schematic cross-sectional view showing a procedure for manufacturing the semiconductor package of the third embodiment.

FIGS. 17 and 18 show a semiconductor package 1B in different states during a manufacturing process. More specifically, FIG. 17 shows the semiconductor package 1B when an upper chip 4A is stacked on a lower chip 3A, which is flip-chip bonded to the wiring substrate 2. Each of the semiconductor chips 3A and 4A is an example of a semiconductor device. The semiconductor chip 3A is one example of a first semiconductor device, and the semiconductor chip 4A is one example of a second semiconductor device.

Referring to FIG. 17A, in the lower chip 3A of the third embodiment, connection terminals 34A are formed on the top surfaces 32B of the through electrodes 32. Presolder may be used to form the connection terminals 34A. Lead-free solder, such as Sn-3.5Ag, Sn-2.5Ag, Sn-3.0Ag-0.5Cu, and Sn—Cu may be used as the material of the presolder. The connection terminals 34A (presolder) may be formed by adhering very fine particles (diameter of 10 µm or less) of solder powder to the top surfaces 32B of the through electrodes 32 and melting the solder powder. Further, after applying a solder paste to or mounting solder balls on the top surfaces 32B of the through electrodes 32, a reflow process is performed to form the connection terminals 34A.

In the upper chip 4A of the third embodiment, the connection terminals 55 are formed on the electrode pads 52P, which are exposed from the openings 51X of the protective film 51. The electrode pads 52P electrically connect the connection terminals 55 to a semiconductor integrated circuit (not shown). Each connection terminal 55 is a pillar-shaped connection bump extending downward from the lower surface of the corresponding electrode pad 52P. The connection terminals 55 are aligned with the connection terminals 34A formed on the lower chip 3A. Each connection terminal 55 has a height of, for example, 20 to 40 µm and a diameter of, for example, 10 to 40 µm. Further, the pitch of the connection terminals 55 is approximately 30 to 60 µm. The connection terminals 55 may be formed from, for example, copper or copper alloy.

A solder layer 56 is formed on the lower surfaces of the connection terminals 55. The solder layer 56 may be formed from, for example, a solder plating of a lead-free solder (Sn-2.5Ag or the like). The solder layer 56 has a height of, for example, approximately 5 to 10 µm. The connection terminals 55 and the solder layer 56 are formed, for example, in the same manner as the connection terminals 45 and the metal layer 46 (for example, refer to FIGS. 5A to 6A). Further, the connection terminals 55 and the solder layer 56 are covered by an insulative layer 54A, which is in a B-stage state. For example, an epoxy resin may be used as the material of the insulative layer 54A.

In the step shown in FIG. 17A, the upper chip 4A is arranged above the lower chip 3A, which includes the connection terminals 34A. Further, the connection terminals 34A of the lower chip 3A are aligned with the connection terminals 55 (solder layer 56), which are formed on the electrode pads 52P of the upper chip 4A.

In the step shown in FIG. 17B, the connection terminals 55 of the upper chip 4A are flip-chip bonded to the connection terminals 34A formed on the through electrodes 32. In this state, the lower surface of the insulative layer 54A of the upper chip 4A is adhered to the upper surface of the insulative layer 31 of the lower chip 3A. Further, the connection terminals 55 and the solder layer 56 of the upper chip 4A pierce the insulative layer 54A, which is in the semi-cured state, and contact the connection terminals 34A of the lower chip 3. This electrically connects the connection terminals 55 and 34A. The connection terminals 55 are connected to the connection terminals 34A by, for example, heating the solder layer 56 and the connection terminals 34 to approximately 230° C. to 260° C. and melting and curing solder. Since the solder layer 56 and the connection terminals 34A are formed from solder, the solder layer 56 and each connection terminal 34A melt into an alloy and form a single solder bump 34B. The solder bumps 34B electrically connect the through electrodes 32 and the connection terminals 55. This electrically connects the electrode pads 52P of the upper chip 4A to the connection terminals 55 with the through electrodes 32. Consequently, the electrode pads 52P of the upper chip 4A are electrically connected to the electrode pads 20P of the wiring substrate 2 by the through electrodes 32. The insulative layer 54A, which is in a B-stage state, undergoes a heating process during the stacking or after the stacking. This heats the insulative layer 54A for a predetermined time to a curing temperature or higher and cures the insulative layer 54A. The thermal curing forms the insulative layer 54, and the lower surface of the insulative layer 54 is adhered to the upper surface of the insulative layer 31. Further, the insulative layer 54 covers the through electrodes 32, the solder bumps 34B, the connection terminals 55, and the electrode pads 52P.

Next, in the step shown in FIG. 18, the encapsulation resin 5 is formed to seal the semiconductor chips 3A and 4A stacked on the wiring substrate 2. Then, the external connection terminals 24 are formed on the external connection pads 23P of the wiring substrate 2. The semiconductor package 1B of the third embodiment is manufactured in this manner through the steps described above.

In addition to advantages (1) to (6) of the first embodiment, the third embodiment has the advantages described below.

(8) The connection terminals 34A, which are formed from presolder, are formed on the top surfaces 32B of the through electrodes 32 in the lower chip 3A. Further, the pillar-shaped connection terminals 55 and the solder layer 56 are formed on the electrode pads 52P of the upper chip 4A. This bonds the lower chip 3A and the upper chip 4A with solder. Thus, for example, in comparison with when forming only one of the lower chip 3A and the upper chip 4A with solder, the increase in the bonding solder amount (solder volume) increases the connection strength. Accordingly, the reliability of the connection between the lower chip 3A and the upper chip 4A is improved.

Very fine solder powder may be adhered to the top surfaces 32B of the through electrodes and melted to form the connection terminals 34A. This forms fine connection terminals 34A and allows for easy application to a large number of pins and narrow pitch pads.

It should be apparent to those skilled in the art that the present invention may be embodied in many other specific forms without departing from the spirit or scope of the invention. Particularly, it should be understood that the present invention may be embodied in the following forms.

In each of the above embodiments, the type and number of semiconductor chips stacked on the wiring substrate 2 is not particularly limited. For example, the semiconductor chips stacked on the wiring substrate 2 may all be used for a memory device.

In each of the above embodiments, for example, the insulative layer 54A, which is in a semi-cured state, is formed on the lower side of the upper chip 4, and the upper chip 4 is stacked on the lower chip 3. Then, the insulative layer 54A is thermally cured to form the insulative layer 54. The insulative layer 54 functions in the same manner as an underfill. However, the present invention is not limited to such a structure. For example, after stacking the upper chip 4 on the lower chip 3, an underfill may be filled between the lower chip 3 and the upper chip 4.

In each of the above embodiments, for example, the material of the connection terminals 34 and 84 respectively formed on the top surfaces 32B and 82B of the through electrodes 32 and 82 and the material of the connection terminals 53 and 95 respectively formed on the electrode pads 52P and 93P may be changed to a different combination when necessary. For example, when the connection terminals 34 and 84 are formed by an Ni/Au layer, it is preferred that the connection terminals 53 and 95 be formed by an Ni/Au/Sn layer or an Ni/Pd/Au/Sn layer. Further, when the connection terminals 34 and 84 are formed by an Sn layer, it is preferred that the connection terminals 53 and 95 be formed by an Ni/Au layer or an Ni/Pd/Au layer.

Further, when the connection terminals 34 and 84 are formed by an Ni/Au layer, it is preferred that a solder layer be used as the pillar-shaped connection bumps for the connection terminals 53 and 95. In this case, for example, as shown in FIG. 19A, an Ni/Au layer of connection terminals 34 are formed on the top surfaces 32B of the through electrodes 32 in the lower chip 3. The pillar-shaped connection terminals 55 extend downward from the lower surfaces of the electrode pads 52P of the upper chip 4A, and the solder layer 56 is formed on the connection terminals 55. In the step shown in FIG. 19A, the upper chip 4A is arranged above the lower chip 3 so that the connection terminals 34 of the lower chip 3 are opposed to the connection terminals 55 of the upper chip 4A. Then, as shown in FIG. 19B, the connection terminals 55 of the upper chip 4A are flip-chip bonded to the connection terminals 34 formed on the through electrodes 32. Namely, the lower surface of the insulative layer 54A of the upper chip 4A is adhered to the upper surface of the insulative layer 31 of the lower chip 3, and the connection terminals 55 of the upper chip 4A and the solder layer 56 pierce the insulative layer 54A, which is in a semi-cured state, and are electrically connected to the connection terminals 34. In this case, for example, the solder layer 56 is heated to approximately 230° C. to 260° C., and solder is melted and cured. This electrically connects the connection terminals 55 and the connection terminals 34 with the solder layer 56. Thus, the connection terminals 55, the solder layer 56, and the connection terminals 34 electrically connect the electrode pads 52P of the upper chip 4A to the through electrodes 32.

In each of the above embodiments, when decreasing the thickness of each of the insulative layer 31, the insulative film 33, and the conductive layer 32A to form the through electrodes 32 (refer to FIG. 7C), the insulative layer 31, the insulative film 33, and the conductive layer 32A undergo bite grinding. However, the present invention is not limited in such a manner. For example, a CMP apparatus may be used to decrease the thickness of each of the insulative layer 31, the insulative film 33, and the conductive layer 32A and form the through electrodes 32.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
a semiconductor substrate including an upper surface, a lower surface located opposite to the upper surface and serving as an active surface, and a through hole that extends through the semiconductor substrate from the upper surface to the lower surface;
an insulative layer formed from a resin and including an upper surface, a lower surface located opposite to the upper surface of the insulative layer to cover the upper surface of the semiconductor substrate, and an opening, wherein the opening of the insulative layer is aligned with the through hole;
an insulative film that covers an inner wall surface of the through hole and an inner wall surface of the opening of the insulative layer; and
a through electrode formed in the through hole and the opening of the insulative layer inward from the insulative film, wherein the through electrode includes an upper end surface that forms a pad exposed from the upper surface of the insulative layer, wherein the upper end surface of the through electrode is at a same level as the upper surface of the insulative layer.

2. The semiconductor device according to claim 1, wherein
the insulative film is formed on the entire inner wall surface of the through hole and the entire inner wall surface of the opening, and
the through electrode includes a metal barrier layer formed to cover the entire inner wall surface of the insulative film.

3. The semiconductor device according to claim 1, further comprising a connection terminal formed on the upper end surface of the through electrode.

4. The semiconductor device according to claim 3, wherein the connection terminal is formed by either one of:
a tin layer;
a gold layer;
a metal layer formed by a nickel layer and a gold layer applied in this order to the upper end surface of the through electrode;
a metal layer formed by a palladium layer and a gold layer applied in this order to the upper end surface of the through electrode; and
a metal layer formed by a nickel layer, a palladium layer, and a gold layer applied in this order to the upper end surface of the through electrode.

5. The semiconductor device according to claim 3, wherein the connection terminal is formed by a solder.

6. A semiconductor package comprising:
at least a number N of stacked semiconductor devices, where N is an integer of 2 or greater, wherein:
the semiconductor devices include a first semiconductor device, which is stacked at a stage i, where i is an integer from 1 to N-1, and a second semiconductor device, which is stacked at a stage i+1;
the first semiconductor device includes:
a first semiconductor substrate including an upper surface, a lower surface located opposite to the upper surface and serving as an active surface, and a through hole that extends through the first semiconductor substrate from the upper surface to the lower surface;
a first insulative layer formed from a resin and including an upper surface, a lower surface located opposite to the upper surface of the first insulative layer to cover the upper surface of the first semiconductor substrate, and an opening, wherein the opening of the first insulative layer is aligned with the through hole;
an insulative film that covers an inner wall surface of the through hole and an inner wall surface of the opening of the first insulative layer; and
a through electrode formed in the through hole and the opening of the first insulative layer inward from the insulative film, wherein the through electrode includes an upper end surface exposed from the upper surface of the first insulative layer;
the second semiconductor device includes an electrode pad electrically connected to the upper end surface of the through electrode; and
the upper end surface of the through electrode is at a same level as the upper surface of the first insulative layer.

7. The semiconductor package according to claim 6, wherein the second semiconductor device includes:
a second semiconductor substrate including the electrode pad formed on a surface opposing the first semiconductor device; and a second insulative layer formed to cover the electrode pad, wherein the second insulative layer is formed by an insulative resin having the same composition as the first insulative layer.

8. The semiconductor package according to claim 6, wherein:
the first semiconductor device includes a first connection terminal formed on the upper end surface of the through electrode;
the first connection terminal is formed by either one of:
a tin layer;
a gold layer;
a metal layer formed by a nickel layer and a gold layer applied in this order to the upper end surface of the through electrode;
a metal layer formed by a palladium layer and a gold layer applied in this order to the upper end surface of the through electrode; and
a metal layer formed by a nickel layer, a palladium layer, and a gold layer applied in this order to the upper end surface of the through electrode;
the second semiconductor device includes a second connection terminal formed on the electrode pad; and
the second connection terminal is formed by either one of:
a connection terminal formed by a pillar-shaped bump and a solder layer applied in this order to the electrode pad;
a metal layer formed by a nickel layer, a gold layer, and a tin layer applied in this order to the electrode pad;
a metal layer formed by a nickel layer, a palladium layer, a gold layer, and a tin layer applied in this order to the electrode pad;
a metal layer formed by a nickel layer and a gold layer applied in this order to the electrode pad; and
a metal layer formed by a nickel layer, a palladium layer, and a gold layer applied in this order to the electrode pad.

9. The semiconductor package according to claim 6, wherein:
the first semiconductor device includes a first connection terminal formed on the upper end surface of the through electrode;
the first connection terminal is formed by a solder;
the second semiconductor device includes a second connection terminal formed on the electrode pad;
the second connection terminal includes a pillar-shaped bump and a solder layer applied in this order to the electrode pad; and
the first connection terminal and the second connection terminal electrically connect the through electrode and the electrode pad.

10. The semiconductor device according to claim 1, wherein
the insulative film includes an upper surface, which covers the lower surface of the semiconductor substrate, and a lower surface located opposite to the upper surface of the insulative film,
the through electrode includes a lower end surface located opposite to the upper end surface of the through electrode, and
the lower end surface of the through electrode is at a same level as the lower surface of the insulative film.

11. The semiconductor package according to claim 6, wherein
the insulative film includes an upper surface, which covers the lower surface of the first semiconductor substrate, and a lower surface located opposite to the upper surface of the insulative film,
the through electrode includes a lower end surface located opposite to the upper end surface of the through electrode, and
the lower end surface of the through electrode is at a same level as the lower surface of the insulative film.

12. The semiconductor device according to claim 1, further comprising a further insulative layer, which is located at a side of the lower surface of the semiconductor substrate.

13. The semiconductor device according to claim 1, wherein the insulative film entirely covers inner wall surfaces of the semiconductor substrate defining the through hole and inner wall surfaces of the insulative layer defining the opening of the insulative layer.

14. The semiconductor device according to claim 1, wherein the insulative film extends continuously from the lower surface of the semiconductor substrate to the upper surface of the insulative layer to cover the inner wall surface of the through hole and the inner wall surface of the opening.

15. The semiconductor device according to claim 1, wherein the pad formed by the upper end surface of the through electrode is at a same level as the upper surface of the insulative layer.

16. The semiconductor device according to claim 1, wherein the opening of the insulative layer has a diameter that is equal to that of the through hole of the semiconductor substrate.

17. The semiconductor package according to claim 6, wherein the insulative film entirely covers inner wall surfaces of the first semiconductor substrate defining the through hole and inner wall surfaces of the first insulative layer defining the opening of the first insulative layer.

18. The semiconductor package according to claim 6, wherein the insulative film extends continuously from the lower surface of the first semiconductor substrate to the upper surface of the first insulative layer to cover the inner wall surface of the through hole and the inner wall surface of the opening.

19. The semiconductor package according to claim 6, wherein the upper end surface of the through electrode forms a pad, wherein the pad is at a same level as the upper surface of the first insulative layer.

20. The semiconductor package according to claim 6, wherein the opening of the first insulative layer has a diameter that is equal to that of the through hole of the first semiconductor substrate.

* * * * *